(12) United States Patent
Dessard et al.

(10) Patent No.: US 6,870,229 B2
(45) Date of Patent: Mar. 22, 2005

(54) ULTRA-LOW POWER BASIC BLOCKS AND THEIR USES

(75) Inventors: Vincent Dessard, Louvain la Neuve (BE); Stéphane Adriaensen, Rhode-Saint-Genèse (BE); Denis Flandre, Brussels (BE); David Levacq, Brussels (BE)

(73) Assignee: Universite Catholique de Louvain, Belgique (BE)

( * ) Notice: Subject to any disclaimer, the term of this patent is extended or adjusted under 35 U.S.C. 154(b) by 0 days.

(21) Appl. No.: 10/602,016

(22) Filed: Jun. 23, 2003

(65) Prior Publication Data

US 2004/0026760 A1 Feb. 12, 2004

Related U.S. Application Data

(60) Division of application No. 10/602,016, filed on Jun. 23, 2003, which is a continuation-in-part of application No. PCT/EP01/15023, filed on Dec. 17, 2001.

(30) Foreign Application Priority Data

Dec. 21, 2000 (EP) .............................. 00870313

(51) Int. Cl.$^7$ .............................. H01L 23/62; H02H 9/00
(52) U.S. Cl. ........................ 257/360; 257/357; 257/364; 257/365; 361/56; 361/58; 361/91.1; 361/111
(58) Field of Search .......................... 361/56, 58, 91.1, 361/11, 117, 119; 257/357, 360, 364, 365; 327/313, 314, 325

(56) References Cited

U.S. PATENT DOCUMENTS

| | | | | | |
|---|---|---|---|---|---|
| 5,977,594 | A | * | 11/1999 | Takao | ........................ 257/357 |
| 6,040,610 | A | * | 3/2000 | Noguchi et al. | ............ 257/392 |
| 6,069,782 | A | * | 5/2000 | Lien et al. | ................... 361/111 |

\* cited by examiner

Primary Examiner—Donghee Kang
(74) Attorney, Agent, or Firm—Barnes & Thornburg LLP

(57) ABSTRACT

The present invention relates to an ultra-low power (ULP) MOS diode. The diode has a first and a second terminal. It comprises an n-MOS transistor having a channel, a first N+ doped diffusion region at one extremity of the channel and a second N+ diffusion region at the other extremity of the channel, and a p-MOS transistor having a channel and a first P+ doped diffusion region at one extremity of the channel and a second P+ diffusion region at the other extremity of the channel. The first N+ diffusion region of the n-MOS transistor is coupled to the first P+ diffusion region of the p-MOS transistor, the gate of the n-MOS transistor is coupled to the second P+ diffusion region of the p-MOS transistor, and the gate of the p-MOS transistor is coupled to the second N+ diffusion region of the n-MOS transistor. The second P+ diffusion region of the p-MOS transistor is coupled to the first terminal of the diode and the second N+ diffusion region of the n-MOS transistor is coupled to the second terminal of the diode. The diode has a current versus voltage characteristic such that it has a negative slope in a reverse biased state of the diode.

10 Claims, 18 Drawing Sheets

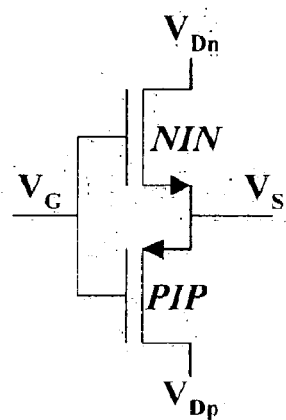 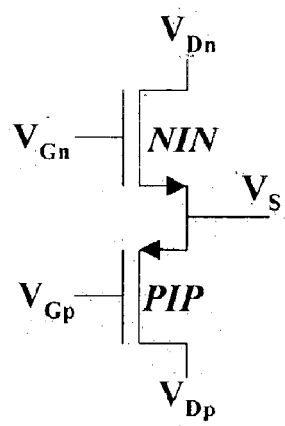
Fig. 7                                Fig. 9
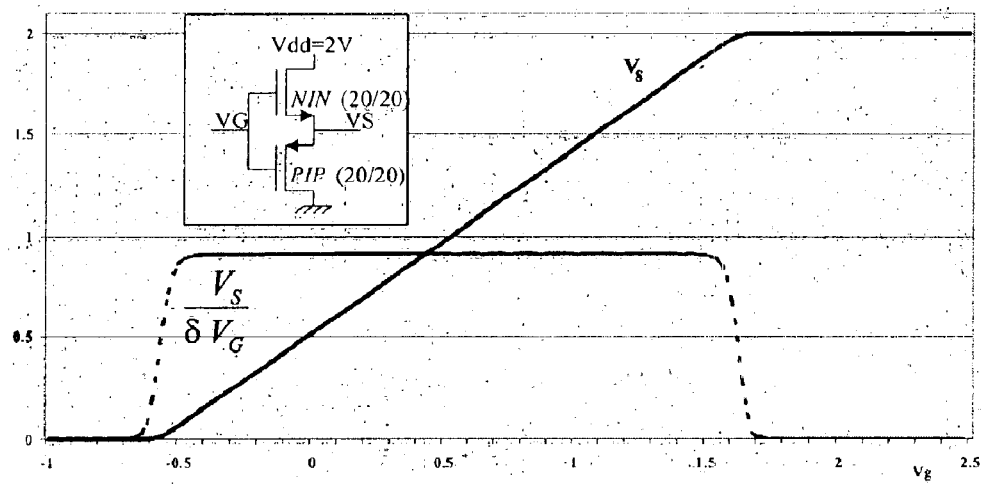
Fig. 8
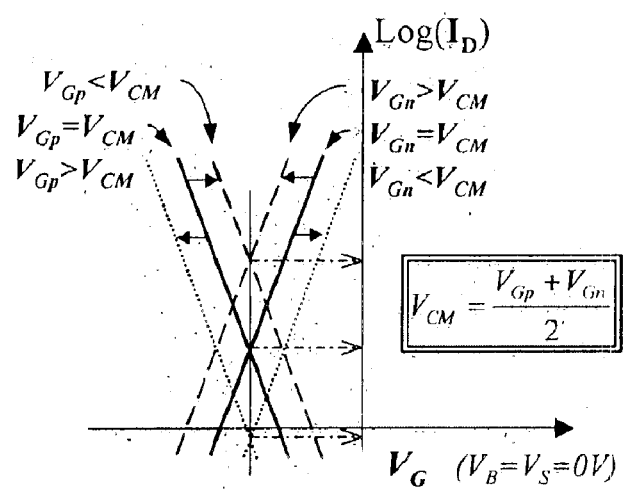
Fig. 10

ULTRA-LOW POWER BASIC BLOCKS AND THEIR USES

RELATED APPLICATION

This application is a division of co-pending U.S. patent application Ser. No. 10/602,016, filed Jun. 23, 2003 which is a continuation-in-part of International Application No. PCT/EP01/15023, filed Dec. 17, 2001 which claims priority from European Application No. 00870313.4, filed Dec. 21, 2000.

TECHNICAL FIELD OF THE INVENTION

The present invention relates to electronic circuits, more specifically ultra-low power electronic circuits. The present invention relates particularly to analog circuits.

BACKGROUND OF THE INVENTION

Today's electronic devices are built by connecting together electrical components, ranging from a few electrical components for more simple circuits to millions of them for more complex circuits. Low power has become one of the main issues in electronics industry for many product areas such as cellular telephones, biomedical implants, digital watches, calculators, tape players, portable computers, in short all kinds of portable and battery powered electronic devices.

There where household electronic devices that are powered by mains voltage can tolerate a certain power loss in the electronic circuits, battery powered devices cannot. For these devices, this power loss has a direct connection with the battery life, and a shorter battery life directly impacts the usability of the device.

Power loss in a circuit is among other things dependent upon the supply voltage. Reducing the supply voltage of an electronic circuit requires a reduction of the threshold voltages of the MOS devices in the circuit. It is known that MOSFET sub-threshold current, which is the transistor current if the transistor is biased below the threshold voltage, increases exponentially as threshold voltage is reduced. Therefore MOSFET devices with low threshold voltages generally have relatively large leakage currents. In order to avoid this leakage current problem up to now the threshold voltage of all transistors in a circuit is made sufficiently high to prevent leakage. Furthermore, in a basic CMOS (Complementary Metal Oxide Semiconductor) bulk process for making electronic circuits, n-MOS and p-MOS transistor threshold voltages are chosen as symmetrical as possible for digital circuit considerations, in order to minimise the static circuit consumption, i.e. minimisation of the off-state current. Analog performance can be improved if transistors with different threshold voltages are available, mainly for dynamic voltage range purposes. Even n-MOS transistors with a negative threshold voltage or p-MOS transistors with a positive threshold voltage can be very useful. But even then, if such n-MOS and p-MOS transistors are used, they have symmetrical threshold voltages.

Different kinds of electronic low power components or low power circuits are known, which use standard CMOS components coupled to each other in a particular way in order to minimise power loss.

U.S. Pat. No. 5,506,527 describes a low power diode having a comparator for comparing the voltage present at the anode and the cathode of the diode. When the comparator determines that the voltage present at the anode of the low power diode equals or exceeds the voltage present at the cathode of the low power diode by a predetermined forward voltage, a signal is generated. This signal turns on a transistor acting as a switch, which in turn electronically connects the anode and the cathode of the low power diode together. Unlike conventional diodes that have a forward voltage of approximately 0.7 Volts (depending on the physical silicon junction property of the diode), the described low power diode has a very small forward voltage of approximately 0.25 Volts (depending on the drain to source resistance of the switch when on and on the offset of the comparator). This diode thus has a low threshold voltage and at the same time a small leakage current.

U.S. Pat. No. 4,860,257 describes a level-shift circuit with large sized p-MOS transistors and small sized n-MOS transistors. Low power dissipation in this case results from the fact that the current conducting circuit is connected through very small transistors when the clock is active, and that the current-conducting circuit disappears when the clock is not active.

It is an object of the present invention to provide an ultra-low power (ULP) device with a low threshold and at the same time low leakage current, which ULP device can be used as a basic block in low power applications.

SUMMARY OF THE INVENTION

The above objective is accomplished by an ultra-low power device comprising a series connection of an n-MOS transistor and a p-MOS transistor each having a source and a drain, whereby the source of the n-MOS transistor is coupled with the source of the p-MOS transistor. The device may be an analog device. Both transistors are such that the absolute values of their threshold voltages are different, and that the absolute value of the relative difference of both threshold voltages is between 0.9 and 1.3 Volts. An ultra-low power device according to the present invention preferably does not dissipate more than 10 $\mu$W, preferably not more than 1 $\mu$W. Such an ultra-low power device may be used as a differential transconductance element able to push and/or pull current, depending on the access node observed.

According to a further embodiment of the present invention, the n-MOS and the p-MOS transistor, each having at least one gate, are connected with their gates together, thus forming a common gate. This common gate may preferably be coupled to ground or to a positive power supply. Such an ultra-low power device with common gate may be used as a level shifter. According to a further embodiment of the present invention, it may be used as a voltage reference.

Ultra-low power devices according to the present invention may be horizontally cascaded. Such a cascade is an ultra-low power circuit wherein a first and a second ultra-low power device with common gate are connected together. The sources of the n-MOS and p-MOS transistors of the first ultra-low power device are then connected to the common gate of the second ultra-low power device. According to a further embodiment of the present invention, the drain of the p-MOS transistor of the first ultra-low power device may be connected with the drain of the p-MOS transistor of the second ultra-low power device to a same potential. In use, preferably all transistors in this ultra-low power circuit should be saturated.

Ultra-low power devices according to the present invention may also be vertically cascaded. Such a cascade is an ultra-low power circuit wherein a first and a second ultra-low power device with common gate are connected together. The drain of the p-MOS transistor of the second ultra-low power device and the drain of the n-MOS transistor of the first ultra-low power device are connected together, and the sources of the n-MOS and the p-MOS transistors of the first ultra-low power device are connected to the common gate of the second ultra-low power device.

According to another embodiment of the present invention, a first ultra-low power device with common gate coupled to a positive power supply may be connected to an ultra-low power device with separate gates for the n-MOS and the p-MOS transistors, whereby the drain of the p-MOS transistor of the first ultra-low power device and the drain of the n-MOS transistor of the second ultra-low power device are coupled together. This ultra-low power circuit may be used as an operational transconductance amplifier.

Furthermore, the present invention provides a diode having a first and a second terminal. The diode comprises an n-MOS transistor having a channel, a first N+ doped diffusion region at one extremity of the channel and a second N+ diffusion region at the other extremity of the channel, and a p-MOS transistor having a channel and a first P+ doped diffusion region at one extremity of the channel and a second P+ diffusion region at the other extremity of the channel. The first N+ diffusion region of the n-MOS transistor is coupled to the first P+ diffusion region of the p-MOS transistor. The gate of the n-MOS transistor is coupled to the second P+ diffusion region of the p-MOS transistor, and the gate of the p-MOS transistor is coupled to the second N+ diffusion region of the n-MOS transistor. The second P+ diffusion region of the p-MOS transistor is coupled to the first terminal of the diode and the second N+ diffusion region of the n-MOS transistor is coupled to the second terminal of the diode.

According to a preferred embodiment, a current versus voltage characteristic of the diode is such that it has a negative slope in a reverse biased state of the diode. That is it displays a negative resistance in a region of the reverse biased state of the diode. Preferably, the current versus voltage characteristic of the diode passes substantially through the origin of the current versus voltage characteristic.

The present invention also provides a voltage doubler which comprises two diodes according to the present invention which are coupled in series between a supply voltage node and an output node. The anode of the first diode is coupled to the supply voltage node, and the cathode of the second diode is coupled to the output node. A clock signal switching between a first and a second voltage level is applied to the node between the cathode of the first diode and the anode of the second diode, and a load capacitance is connected to the output node.

The present invention also provides a memory cell comprising two ultra-low power diodes according to the present invention which are coupled in series reversed biased between a first low voltage level and a second high voltage level. The voltage level of the memory cell being present at the node between the two ultra-low power diodes. This memory cell may be used in a plurality of applications, of which some are explained in more detail in the detailed description.

The present invention also provides an electrostatic discharge protection circuit which comprises a first reverse biased diode between a node to be protected and a first power supply and a second reverse biased diode between the node to be protected and a second power supply. The diodes in this electrostatic discharge protection circuit are diodes according to the present invention.

The present invention furthermore provides a temperature independent voltage reference circuit for generating a reference voltage. It comprises a series connection of an n-MOS and a p-MOS transistor coupled with their sources together. The gates of both transistors are coupled together. The size ratio between both transistors is substantially unity. An output reference voltage of the voltage reference circuit is taken at the sources of the transistors. Preferably, in the temperature independent voltage reference circuit, the n-MOS and the p-MOS transistor have the same channel doping levels.

The present invention also provides an operational transconductance amplifier with a first input node, a second input node and an output node. It comprises a series connection of a first series connection of a first n-MOS and a first p-MOS transistor and a second series connection of the second n-MOS and a second p-MOS transistor. The first n-MOS transistor and the first p-MOS transistor are coupled with their sources together and are coupled with their gates together, thus forming a common gate which is coupled to a positive power supply. The drain of the first n-MOS transistor is also coupled to the positive power supply. The second n-MOS transistor and the second p-MOS transistor are coupled with their sources together. The drain of the second p-MOS transistor is coupled to the negative power supply. The gate of the second n-MOS transistor is coupled to the first input node and the gate of the second p-MOS transistor is coupled to the second input node. The drain of the first p-MOS transistor is connected to the drain of the second n-MOS transistor and to the output node. The first n-MOS transistor and the first p-MOS transistor each have a channel doping level such that the interconnection of the current characteristic in function of the gate to source voltage of both transistors happens at a positive voltage.

Other features and advantages of the present invention will become apparent from the following detailed description, taken in conjunction with the accompanying drawings, which illustrate, by way of example, the principles of the invention.

BRIEF DESCRIPTION OF THE DRAWINGS

FIG. 1(a) shows edge effect cancellation, FIG. 1(b) shows n-MOS doping after field oxide growth, FIG. 1(c) shows p-MOS doping and FIG. 1(d) shows the resulting CMOS devices.

FIG. 2(a) shows edge effect cancellation, FIG. 2(b) shows n-MOS doping after field oxide growth, FIG. 2(c) shows p-MOS doping and FIG. 2(d) shows the resulting CMOS devices.

FIG. 3(a) shows edge effect cancellation, FIG. 3(b) shows n-MOS doping after field oxide growth, FIG. 3(c) shows p-MOS doping and FIG. 3(d) shows the resulting CMOS devices.

FIG. 7 is a schematic representation of a basic ULP (ultra-low power) architecture with intrinsic n-MOS and p-MOS transistors according to the present invention.

FIG. 8 shows a simulation result of a basic ULP architecture of FIG. 7 with the substrate voltage $V_B$=0.

FIG. 9 is a schematic representation of a generalised basic ULP architecture with intrinsic n-MOS and p-MOS transistors according to the present invention.

FIG. 10 represents a graphical interpretation of the current dependence on differential voltages applied on both gates of the generalised basic ULP block of FIG. 9.

DESCRIPTION OF THE ILLUSTRATIVE EMBODIMENTS

The present invention will be described with respect to particular embodiments and with reference to certain drawings but the invention is not limited thereto but only by the claims. The drawings described are only schematic and are non-limiting.

Obtaining Transistors with Low Threshold Voltages

The following notations will be used in the following. Standard n-MOS devices are defined by NP2N, "N" standing for source and drain having heavy doping, and "P2" standing for the standard n-MOS channel doping, which may for example be approximately $6 \times 10^{16}$ atoms/cm$^3$. The channel doping is an ion implantation in the channel region used to adjust the threshold voltage of the MOSFET. Similarly, standard p-MOS devices will be noted by PP1P, with "P" being the source and drain having heavy doping, and "P1" being the standard p-MOS channel doping, which may for example be approximately $1.5 \times 10^{16}$ atoms/cm$^3$. In prior art MOSFETs, the channel doping is such that the threshold voltage (the gate-source voltage at which a transistor starts to conduct) at room temperature is about 0.7 Volts, in order not to have too much leakage current. The standard doping levels given hereinabove are only an indication of what is possible. Doping levels strongly depend on the used technology for making the transistors. For deep-sub-micron processes, doping levels are up to 10 times higher than the ones given above.

In the following non-standard devices will be described.

Figure 1:
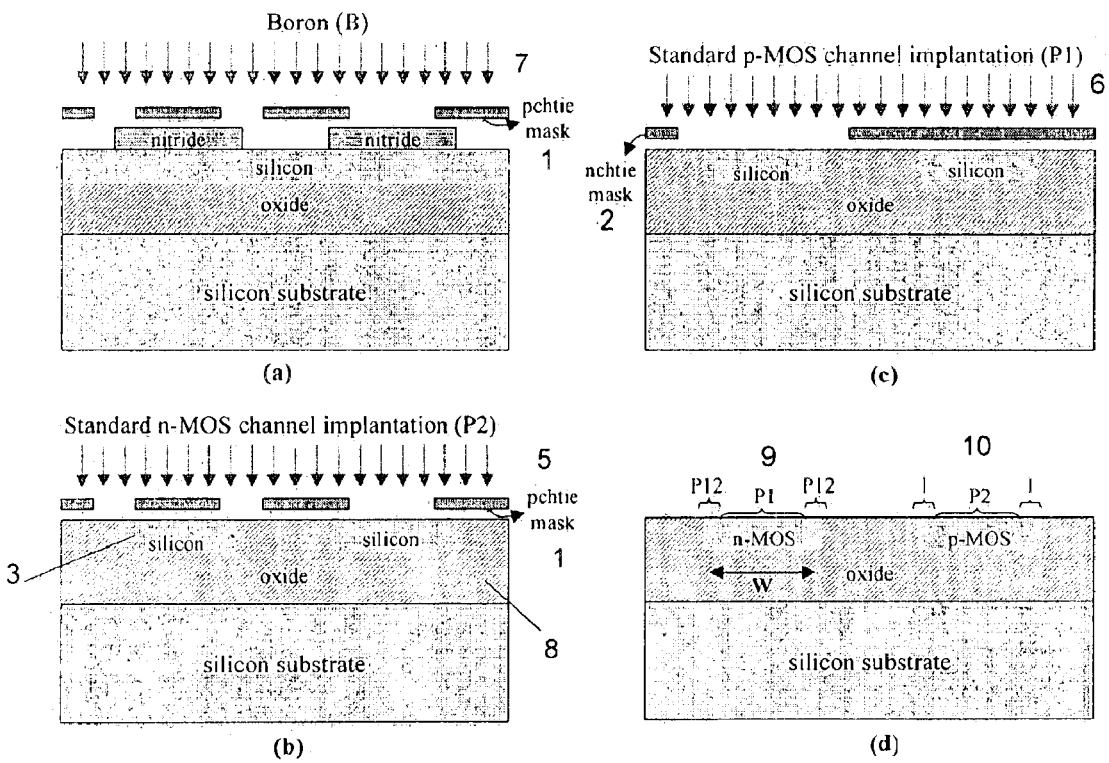
FIGS. 1(a) to (d) represent simplified process steps for obtaining NP1N and PP2P devices in case of SOI-CMOS channel doping.

The first non-standard devices are NP1N and PP2P MOS transistors. They may be obtained by means of a mask arrangement as shown in FIG. 1. Two masks are used, a p-channel-exposure mask 1 and an n-channel-exposure mask 2. The p-channel-exposure mask 1, when opaque, protects the active silicon area 3 against the ion implantation 5 relative to standard inversion mode n-MOS transistor channel doping. The n-channel-exposure mask 2 does the same with the active silicon area for the ion implantation 6 relative to standard accumulation mode p-MOS transistors.

All n-MOS devices have to be treated against edge effects which create leak currents. Two strategies are possible to avoid such edge effect. The first one is based on edgeless transistors. A second strategy consists in changing the doping near the transistor edges. This solution is more difficult to implement than the first one, but it has to be used if the transistor geometry is such that the gate length is similar or higher than the gate width. This kind of sizing is conventional for very low-power analog circuits where weak inversion is usually required.

One way of obtaining edgeless transistors is by large boron implantation in n-MOS oxide edges. For p-MOS it is the opposite. None of them can receive boron implantation near their silicon edges, otherwise a resistive lateral path would be open between source and drain, leading to a large leakage current. In order to have no transistor edge effects in the n-MOS transistors, preferably first a boron dose 7 is implanted along the oxide 8 surrounding the n-MOS transistor active area 3. The p-channel-exposure mask 1 is thereby used to define areas where boron 7 will not be implanted along the field oxide 8 (FIG. 1(a)). The p-channel-exposure mask 1 is thereafter used for carrying out the standard n-MOS channel implementation P2 (FIG. 1 (b)). This p-channel-exposure mask 1, in order to obtain the non-standard devices NP1N and PP2P, shields what will be the p-MOS transistor, and allows the n-MOS channel implantation at what will be the n-MOS transistor. N-MOS transistor edges receive a first P2 doping level. Thereafter, the n-channel-exposure mask 2 is used for carrying out the standard p-MOS channel implantation P1 (FIG. 1(c)). This n-channel-exposure mask 2, in order to obtain the non-standard devices NP1N and PP2P, shields what will be the n-MOS transistor, and allows the p-MOS channel implantation at what will be the p-MOS transistor. The resulting CMOS devices are shown in FIG. 1 (d), with the resulting n-MOS transistor 9 at the left of FIG. 1(d) and the resulting p-MOS transistor 10 at the right of FIG. 1(d).

For standard CMOS devices, the p-channel-exposure mask 1 and the n-channel-exposure mask 2 are geometrically complementary. In order to obtain the non-standard CMOS devices, as can be seen in FIG. 1, the p-channel-exposure mask 1 and the n-channel-exposure mask 2 are not complementary anymore.

The new n-MOS transistor 9 of type NP1N takes advantage of the standard p-MOS device doping level, while the new p-MOS transistor 10 of type PP2P takes advantage of the standard n-MOS device doping level.

Figure 2:
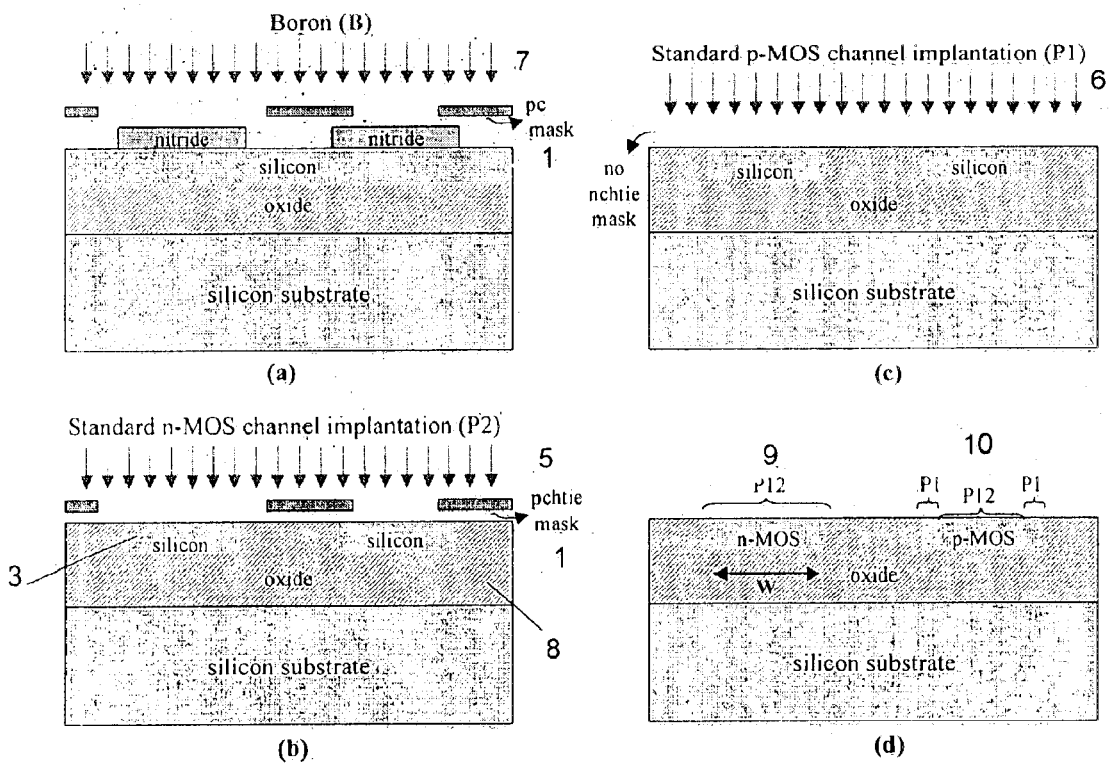
FIGS. 2(a) to (d) represent simplified process steps for obtaining NP12N and PP12P devices in case of SOI-CMOS channel doping.

Other doping combinations can also be implemented. They are based on the summation of both doping level P1 and P2 (further called P12). Devices such as NP12N and PP12P can therefore be implemented. FIG. 2 presents simplified process steps relative to NP12N and PP12P devices. Here again, the n-MOS device is processed in order to avoid edge effect. Therefore, a boron dose 7 is implanted along the oxide 8 surrounding the n-MOS transistor active area 11 by using a p-channel-exposure mask 1, as can be seen in FIG. 2(a). The p-channel-exposure mask 1 is thereafter used again for carrying out the ion implantation 5 relative to standard inversion mode n-MOS transistors channel doping (P2) (FIG. 2(b)). The whole n-MOS transistor and the channel area of the p-MOS transistor receive this ion implantation 5. No mask is used when carrying out the ion implantation 6 relative to standard inversion mode p-MOS transistor channel doping (P1), so that the whole n-MOS transistor as well as the whole p-MOS transistor get this implantation (FIG. 2(c)). The resulting CMOS devices are shown in FIG. 2(d), with the resulting n-MOS transistor 9 at the left of FIG. 2(d) and the resulting p-MOS transistor 10 at the right of FIG. 2(d).

Figure 3:
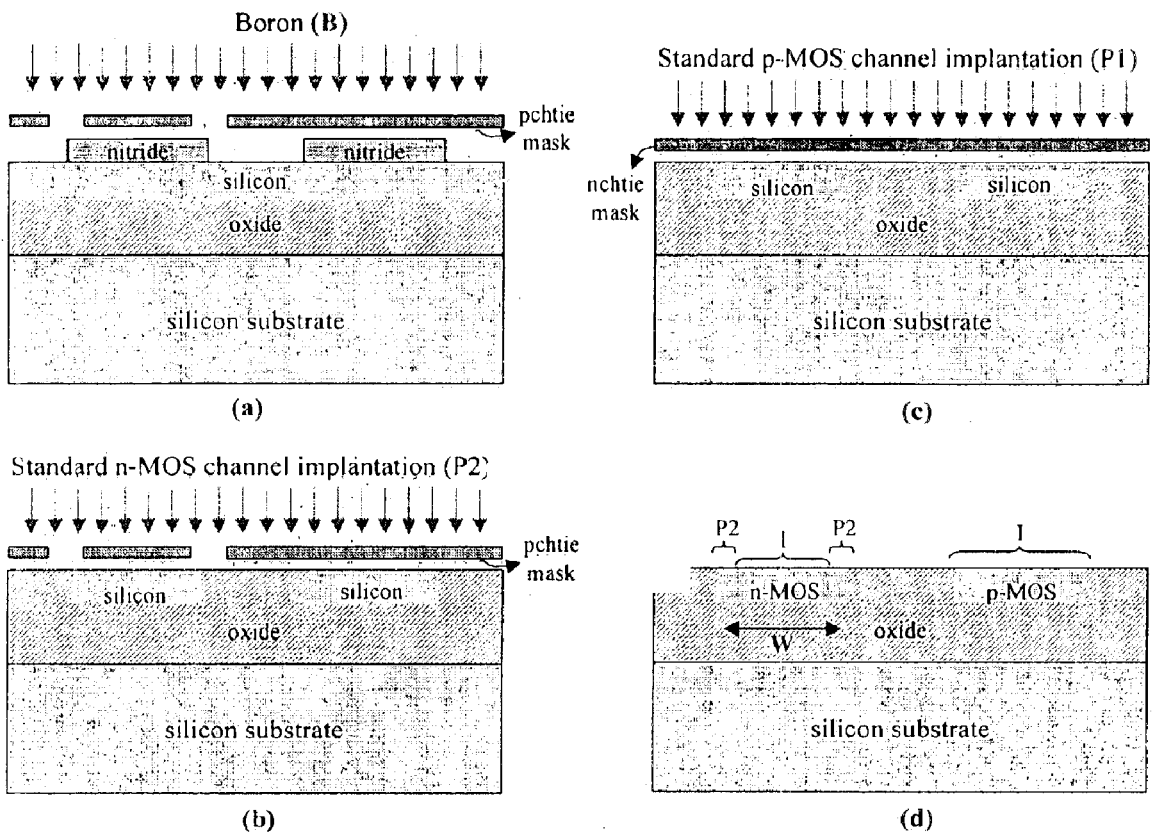
FIGS. 3(a) to (d) represent simplified process steps for obtaining intrinsic NIN and PIP devices in case of SOI-CMOS channel doping.

Also CMOS devices without any channel doping implantation can be implemented (FIG. 3). Such devices will be noted NIN and PIP with "I" standing for an intrinsic region (even if in practice, SOI wafers provided by industry are not intrinsic but are usually slightly p-type doped). In the intrinsic region, the acceptor doping concentration may be approximately $1 \times 10^{15}$ atoms/cm$^3$. In a first step a p-channel-exposure mask 1 is used to define areas where boron will not be implanted along the field oxide 8, so that boron is only implanted along the oxide 8 surrounding the n-MOS transistor active area 11 (FIG. 3(a)). The same p-channel-exposure mask 1 is used in a second step for carrying out an ion implantation 5 relative to standard n-MOS channel doping implementation P2 (FIG. 3(b)). This p-channel-exposure mask 1 only allows the implantation to be carried out at the edge regions of the n-MOS transistor. An n-channel-exposure mask 2 blocks every ion implantation 6 relative to standard p-MOS transistor channel doping (P2) (FIG. 3(c)). The resulting CMOS devices are shown in FIG. 3(d), with the resulting n-MOS transistor 9 at the left of FIG. 3(d) and the resulting p-MOS transistor 10 at the right of FIG. 3(d). The doping profile of the n-MOS transistor 9 is not uniform over the transistor width as it requires edge effect lateral implementation.

Furthermore, an additional mask may be used to implant an n-type channel ion implantation (doping level called N). For CMOS devices, such a mask allows to implement two new transistors, called NNN and PNP. NNN and PNP devices are implemented at first exactly like NIN and PIP devices respectively. Selected intrinsic devices are then implanted on an additional process step with the "N" doping level mask.

Figure 4:
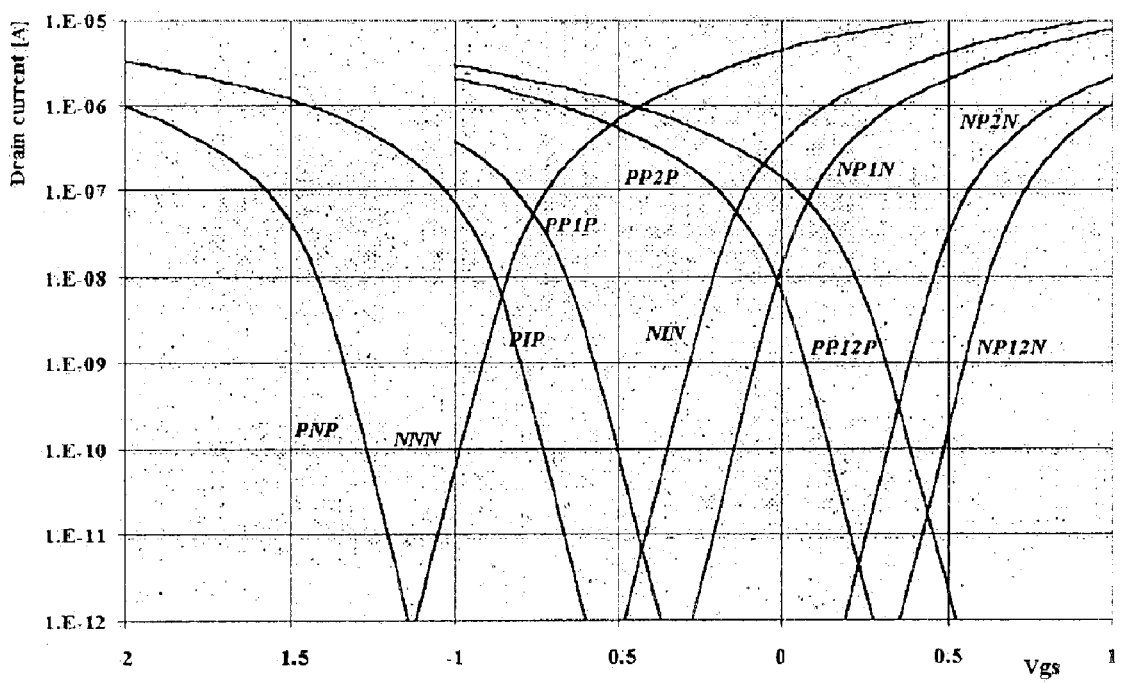
FIG. 4 is a graph of the Id-Vg curves of various CMOS devices obtained with an SOI CMOS process, simulated at room temperature (20° C.) with the active silicon film thickness $t_{si}$=80 nm, the thickness of the front oxide $t_{fox}$=30 nm, the thickness of the back gate oxide $t_{box}$=390 nm, the back gate to source voltage $V_{bs}$=0 V, the potential difference between drain and source $|V_{ds}|$=1 V, and with an aspect ratio of width/length=1 μm/3 μm.

All the above devices have been simulated. Simulated drain currents versus gate to source voltages for both n-MOS and p-MOS transistors for N, I, P1, P2 and P12 doping types are represented in FIG. 4. Each of the different devices presents a different threshold voltage. Based on the simulations, it can be concluded that any of these devices should present significant leakage current compared to standard CMOS devices. Furthermore, sub-threshold slopes are all similar to the ones of standard devices (~70 mV/decade at room temperature), which means that all the devices are fully depleted at room temperature.

The threshold voltage for a fully depleted n-MOSFET working in inversion $$V_{th1,depl} = \phi_{MS1} - \frac{Q_{ox1}}{C_{ox1}} + \left(1 + \frac{C_{si}}{C_{ox1}}\right) \cdot \frac{2kT}{q} \ln\left(\frac{N_A}{n_i}\right) - \frac{C_{si}C_{ox2}}{C_{ox1}(C_{si} + C_{ox2})}(V_{G2} - V_{G2,acc}) + \frac{qN_A t_{si}}{2C_{ox1}}$$

mode is given by:

whereby $\Phi_{MS1}$ means the metal semiconductor work function (i.e. the difference between the front gate material Fermi level and the Silicon Fermi level)

$Q_{ox1}$ means the front oxide trapped charge $C_{ox1}$ means the front gate oxide capacitance $C_{ox2}$ means the back gate oxide capacitance $C_{Si}$ means the silicon film capacitance when fully depleted k is the Boltzmann constant T is the absolute temperature q is the electron charge $N_A$ is the acceptor doping concentration in the active Silicon film [atoms/cm$^3$]

$n_i$ means the Silicon intrinsic carrier number [atoms/cm$^3$]

$V_{G2}$ is the back gate voltage $V_{G2.acc}$ is the back gate voltage corresponding to the occurrence of accumulation mode at the back interface $t_{Si}$ means the active Silicon film thickness As long as the doping level is low (as for example for the intrinsic device NIN or PIP), the threshold voltage is not very sensitive to the doping level (i.e. contribution of the last term of the equation can be neglected in the $V_{th1.depl}$ value). Thanks to this fact, intrinsic transistors present slightly better matching properties than other doped ones.

Basic ULP Block

Figure 5:
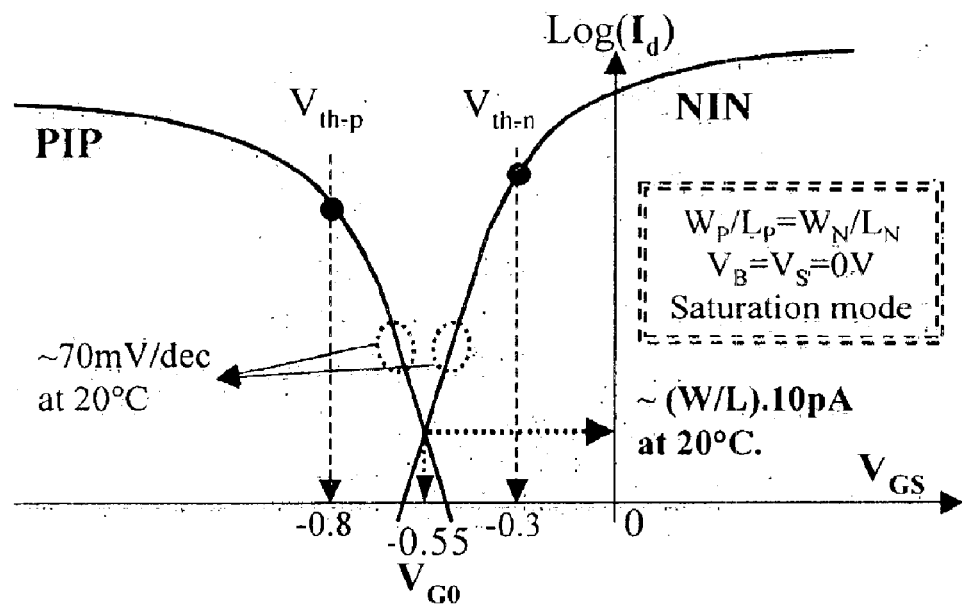
FIG. 5 represents theoretical Id-Vg curves (transistor current in function of the gate-source voltage) for geometrical identical intrinsic FD-SOI n- and p-MOS transistors at room temperature, with substrate voltage $V_B$=source voltage $V_S$=0.

The principle of a first proposed basic cell in accordance with an embodiment of the present invention can be understood from FIG. 4. As an example, only intrinsic n-MOS (NIN) and p-MOS (PIP) characteristics for transistors having the same aspect ratio ($W_p/L_p = W_N/L_N = 20/20$, where W is the channel width and L is the channel length) are considered, as represented in FIG. 5. However, any other combination of n-MOS and p-MOS transistors whereby the absolute values of the threshold voltages of both transistors are different and whereby the absolute value of the relative difference of the threshold voltages of the two transistors is between 0.9 and 1.3 Volts, can be used for the basic cell according to the present invention.

Threshold voltages for intrinsic n- and p-MOSFET are about −0.3V and −0.8V respectively. The intersection of these curves is characterised by a gate to source voltage close to −0.55 V and a current about 10 pA at room temperature for the given transistor aspect ratio. For other temperatures, sub-threshold slopes are modified as well as both n and p-MOS threshold voltages. Supposing that both temperature coefficients for $V_{th-n}$ and $V_{th-p}$ are identical (absolute value) and that both sub-threshold slopes evolve similarly, then the intersection locus of the curves of FIG. 5 will go to higher current with increasing temperature, but the crossover gate to source voltage ($V_{G0}$) will remain close to −0.55V. Measurements over temperature for intrinsic devices are presented in FIG. 6. A rough estimation gives a decade of current increase per 50° C. temperature increase. The property of roughly constant voltage ($V_{G0}$) at the intersection of the characteristics of intrinsic n- and p-MOS devices is a basic of the ultra-low power device implemented in embodiments of the the present invention.

In a basic ULP block according to an embodiment of the present invention, an n-MOS transistor and a p-MOS transistor are connected with both their gates and sources together, as can be seen in FIG. 7. Generally, both gates need not be connected together as will be described in a more general basic block below.

The substrate effect is neglected for simplicity in a first approach. Supposing the potential to the drain of the n-MOS transistor $V_{Dn}$ is high enough and the potential to the drain of the p-MOS transistor $V_{Dp}$ is low enough compared to an applied gate voltage $V_G$ in order to ensure saturation of both devices NIN and PIP, then the resulting source voltage $V_S$ will be 0.55 V higher than $V_G$ if both transistors have same sizes ($V_{GS} = V_{G0} = -0.55$ V). (Other difference values are possible if the transistors are of another type, e.g. NNN and PNP). This comes from the fact that both gate and source of both n- and p-MOS transistors are connected together in this architecture. This, with the fact that the current flowing across transistors must be identical, allows to draw, on the same graphic, with the same axis, the Id-Vg curves relative to each device. As currents are identical, the only solution for the $V_S$ node is to be at the intersection ($V_{G0}$) of both Id-Vg characteristics of FIG. 5. This is valid as long as no current is extracted from the $V_S$ node and as long as both devices are saturated.

Figure 6:
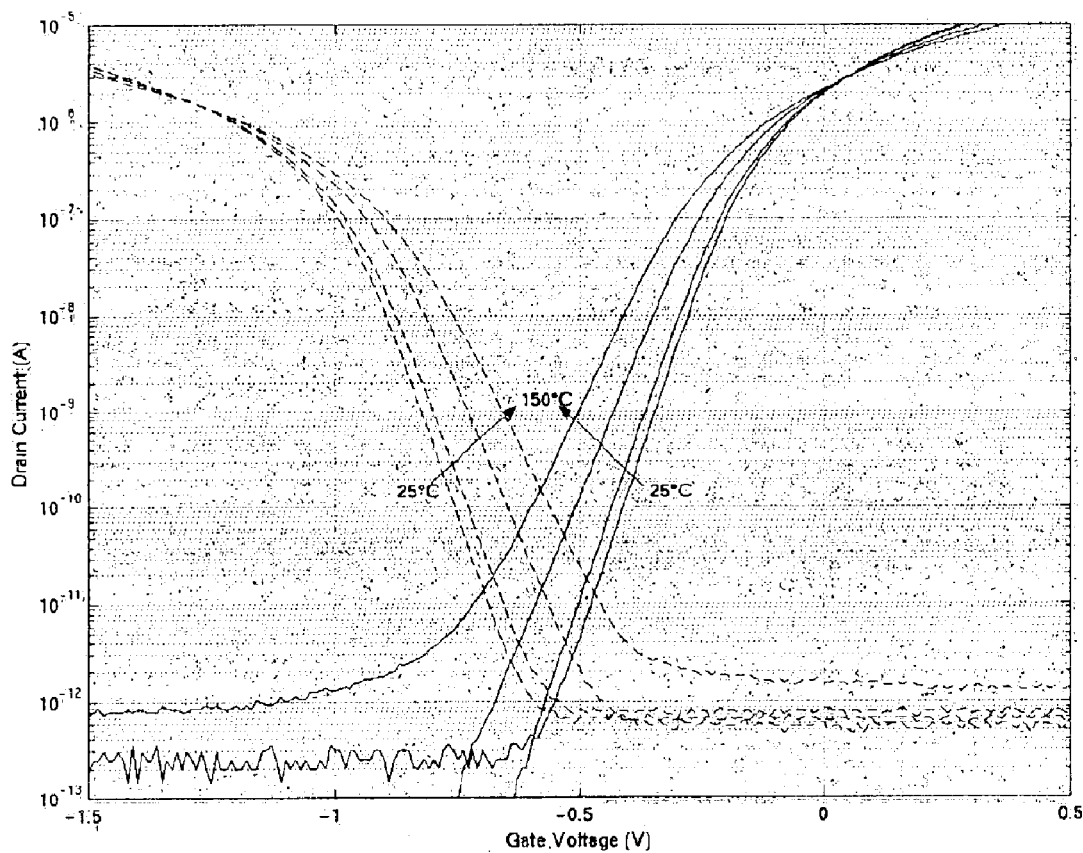
FIG. 6 is a graph of the drain current in function of the gate voltage for intrinsic n- and p-MOS transistors with aspect ratio W/L=20/20 at different temperatures, with source voltage $V_S$=substrate voltage $V_B$=0. The transistors are obtained with an FD-SOI process.

This first architecture integrates two basic functions, i.e. a basic level shifter (between $V_G$ and $V_S$) and an ultra-low current source able to push and/or pull current (double current source) depending on the considered access node ($V_{Dn}$ or $V_{Dp}$). The voltage shift is not very sensitive to temperature, while the current source value is strongly (exponentially) dependent on the temperature, as shown in FIG. 6. The current source property comes from the fact that both drain voltages have virtually no influence on the source voltage as long as devices are saturated. Therefore $V_{GS}$ is independent of drain voltages, which means that current flowing towards both devices is constant at a fixed temperature. If the temperature increases the current increase has an exponential dependence as the device works in weak inversion and is polarised at constant $V_{GS}$.

This basic cell of this embodiment can be considered as a "floating" one (independent of $V_{Dn}$ and $V_{Dp}$) if previous conditions are respected.

As explained previously, the source voltage $V_S$ follows the applied gate voltage $V_G$. If an FD-SOI CMOS processing technology is used, the substrate effect (also called back gate effect) for both intrinsic n- and p-MOS devices is relative to the voltage difference between the common back gate and the common source voltage ($V_{BS}$). As the back gate is usually tied to a constant potential, the substrate effect will only depend on the (common) source voltage. FIG. 5 has been plotted based on the substrate voltage $V_B$=source voltage $V_S$=0. For other voltage differences $V_{BS}$ between substrate and source, Id-Vg curves are shifted, as transistor threshold voltages are correlated to $V_{BS}$ with the substrate effect factor γ. For example for an FD-SOI CMOS processing technology, γ may be close to 0.08 for both n-MOS and p-MOS transistors. This means that if $V_S$ increases, then $V_{BS}$ decreases and both curves of FIG. 5 are shifted to the right by γ.$V_{BS}$. Therefore, the intersection of the curves is also shifted to the right by γ.$V_{BS}$. Due to this effect, the source voltage $V_S$ will not exactly follow the gate voltage $V_G$ with a constant offset.

FIG. 8 shows the simulation result of the basic architecture with the back gate tied to the ground. As can be seen in this simulation, source voltage $V_S$ "follows" gate voltage $V_G$ with a coefficient 1/(1+γ) as long as both transistors are saturated. The voltage shift ($V_{GS}$) is close to 0.55 V when $V_S$=0 V. The weak inversion drain current in saturation mode ($V_D - V_S >$ few kT/q) for n- and p-MOS transistors respectively is:

$$I_{Dn} = I_{Sn}(T) \cdot e^{\frac{(V_B - V_S)(\lambda - 1)}{\lambda \cdot U_T}} \cdot e^{\frac{V_G - V_S}{\lambda \cdot U_T}} \quad \text{(eq. 1)}$$

$$I_{Dp} = I_{Sp}(T) \cdot e^{-\frac{(V_B - V_S)(\lambda - 1)}{\lambda \cdot U_T}} \cdot e^{-\frac{V_G - V_S}{\lambda \cdot U_T}}$$

$I_{Sn}$ and $I_{Sp}$ depend on the transistor type, on the doping level and on the temperature. In practice, they correspond to the extrapolation of the saturation drain current for zero gate to source and zero back-gate to source bias voltages. λ is defined as 1+γ. For the n- and p-MOS devices of the FD-SOI CMOS process mentioned above, λ=1.08. $U_T$ is the thermal voltage defined as kT/q.

The formal relationship between the voltages is then (in a simplified form):

$$V_S = \frac{V_B(\lambda - 1) + V_G - V_{G_0}}{\lambda} \quad \text{(eq. 2)}$$

The basic architecture of FIG. 7 can also be used as a voltage reference. Based on FIG. 4 and equation eq. 2, one can fix a $V_S$ value for a given $V_G$ value. FIG. 4 gives voltage intersections ($V_{G0}$) at −1.12, −0.053, −0.32, +0.23 and +0.44 V for channel doping levels N, I, P1, P2 and P12 respectively. From these values, supposing $\lambda$=1.08 and $V_B$=0 V, possible output values are $$V_S = \frac{V_G}{1.08} + (1.04; 0.49; 0.30; -0.21; -0.41)$$

Volt respectively. For N, I and P1 channel doping levels, if $V_G$ is tied to ground, the obtained reference voltages are respectively 1.04, 0.49 and 0.3 V. For P2 and P12 doping levels, $V_G$ has to be connected to a positive voltage to ensure saturation mode. If $V_G$ is tied to the supply voltage $V_{DD}$, then the output voltages are $$\frac{V_{DD}}{1.08} - (0.21; 0.41)$$

Volts respectively. As mentioned previously, all these voltages are few sensitive to temperature.

Up to now, it has been assumed that both n- and p-MOS devices have the same size. For some applications, it could be interesting to get a reference voltage with some temperature dependence. Such a voltage could, for example, compensate, at first order, the gate to source voltage variation at constant drain current of a MOS transistor in weak inversion in order to get a low level current source less sensitive to temperature. The principle of a temperature dependent voltage source is still based on FIG. 7, but with different sizes for both n- and p-MOS devices. In this case, the intersection locus over temperature ($V_{G0}(T)$) is no longer a vertical line, i.e. $V_{G0}$=constant as it was previously. Defining the size ratio between n- and p-MOS by $$\xi = \frac{\left(\frac{W}{L}\right)_n}{\left(\frac{W}{L}\right)_p}$$

then the temperature coefficient of the reference voltage is $$\frac{\partial V_{G_0}(T, \xi)}{\partial T} = -\frac{\lambda \cdot k}{2 \cdot q} \ln(\xi)$$

k being the Boltzmann constant and q being the electron charge.

Figure 12:
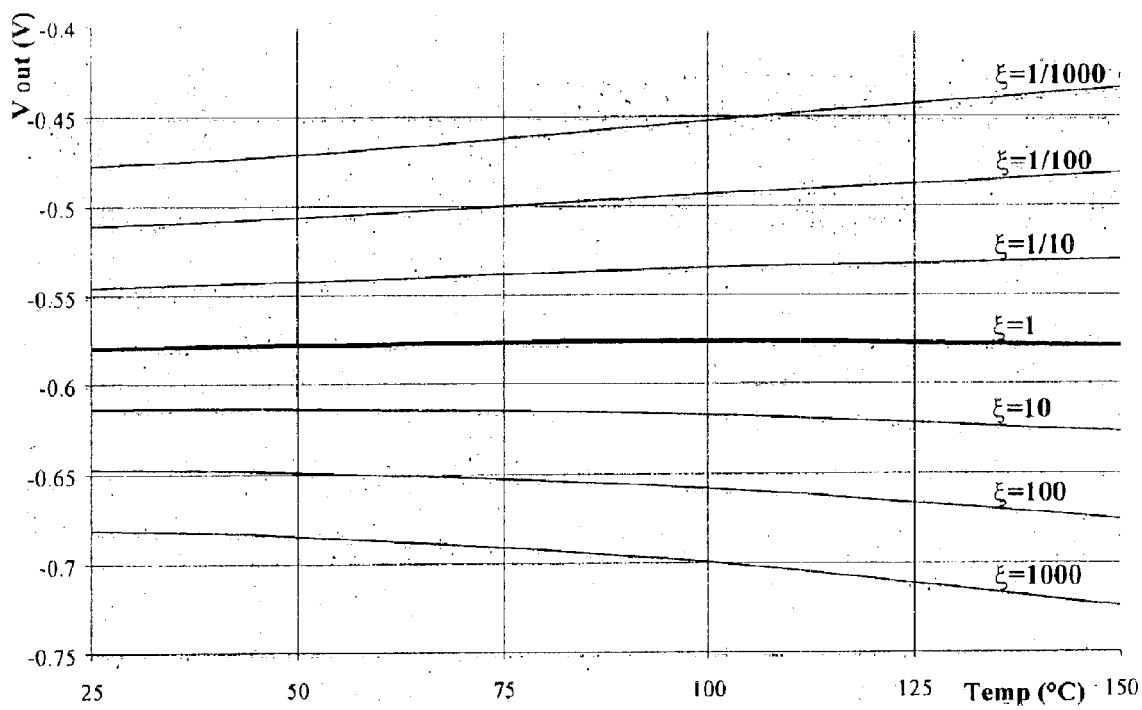
FIG. 12 represents the simulated reference voltage dependence over temperature for various size ratios of n-MOS and p-MOS intrinsic transistors.

FIG. 12 represents the simulated reference voltage dependence over temperature for various size ratios $\xi$. The lower curve corresponds to an n-MOS device being 1000 times wider than the p-MOS device, and the upper curve corresponds to an p-MOS device being 1000 times wider than the n-MOS device. It is to be noted that, if the size ratio is too high, it is difficult to keep both devices in weak inversion.

Generalised Basic ULP Block

As mentioned previously, the architecture of FIG. 7 is restricted due to the common gate implementation. In the generalised basic ULP block of FIG. 9, again an n-MOS transistor of type NIN and a p-MOS transistor of type PIP are connected with their sources together, but now two different gate voltages are used.

The new configuration may be interpreted as exhibited in FIG. 10.

Two gate voltages $V_{Gp}$ and $V_{Gn}$ are considered as a differential voltage as for a standard differential pair, and $V_{CM}$ is considered as the corresponding common mode voltage:

$$V_{CM} = \frac{V_{Gp} + V_{Gn}}{2}$$

If $V_{Gp}$ and $V_{Gn}$ are equal, then the architecture is similar to the previous one with only one common gate. This corresponds to the two solid lines in FIG. 10 which cross at a given current level. If the common mode is constant while $V_{Gp}$ and $V_{Gn}$ respectively increase and decrease (dotted lines), then the crossing occurs at a same voltage level while the current level decreases exponentially with the applied differential voltage. Similarly, if $V_{Gp}$ and $V_{Gn}$ respectively decrease and increase while the common mode stays constant (dashed lines), then the intersection still occurs at a same voltage level while the current value exponentially increases. If the common mode voltage is not constant, then the crossing point of n- and p-MOS Id-Vg curves is shifted due to the substrate effect as explained before. The functionality of this generalised basic block is therefore similar to a floating differential transconductance amplifier, where the output current is also precisely defined by the differential input voltage.

Figure 11:
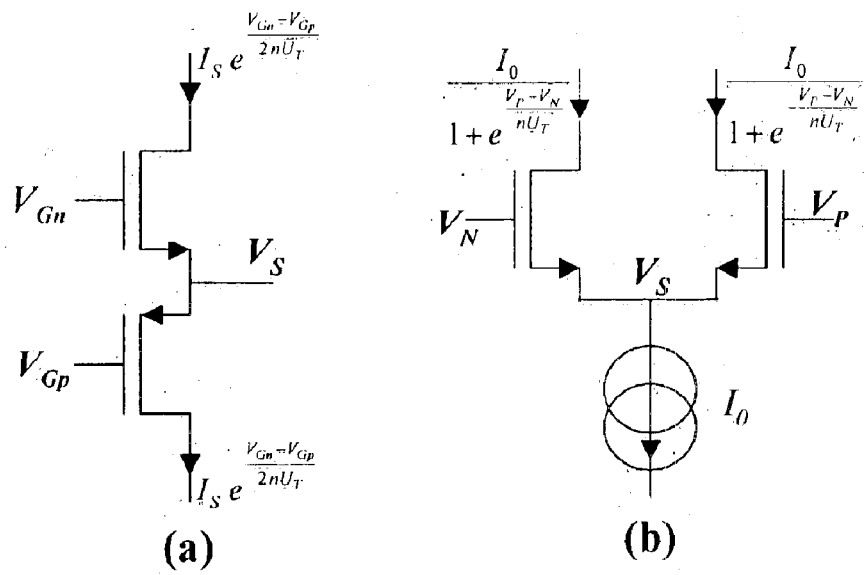
FIG. 11(a) is a schematic representation of a differential transconductance element according to the present invention.
FIG. 11(b) is a schematic representation of a prior art transconductance element

Considering that all devices are in weak inversion, then FIG. 11 compares the new proposed generalised block (a) with a usual differential transconductance architecture (b). The difference between both is that in the new proposed transconductance of FIG. 11 a current source is not necessary. The output current is not limited, it depends exponentially on the input voltage; where in the usual differential transconductance of FIG. 11b, the output current is limited by the bias current source $I_0$.

It is to be noted that up to now, only intrinsic devices (NIN and PIP) have been used in this architecture. In practice, however, all kinds of suitable doping levels can be used with devices in accordance with this embodiment. The doping levels should preferably be chosen so that the absolute values of the threshold voltages of both transistors are different, and whereby the absolute value of the relative difference of both threshold voltages is between 0.9 and 1.3 Volts.

Furthermore, for this general basic block as well, different size ratios between n- and p-MOS transistors can be used, as explained with respect to the first basic block.

Cascade of Basic Cells

Figure 13:
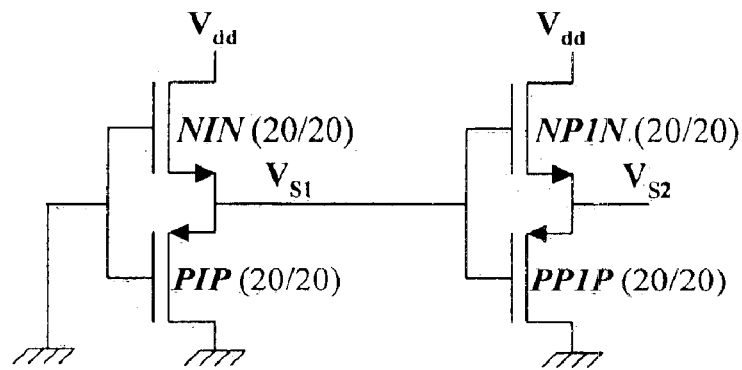
FIG. 13 is a schematic representation of an embodiment of horizontally cascaded basic cells with common gate.

All basic cells can be horizontally cascaded as depicted in FIG. 13. This allows some more intermediate values of reference voltages to be obtained. In FIG. 13, two common gate basic cells are horizontally cascaded, whereby the output node $V_{S1}$ of the first basic cell is connected to the input node $V_G$ of the second basic cell. The first basic cell comprises an n-MOS transistor of type NIN and a p-MOS transistor of type PIP, both transistors having the same size ratio width/length=20 $\mu$m/20 $\mu$m. The second basic cell comprises an n-MOS transistor of type NP1N and a p-MOS transistor of type PP1P, both transistors again having the same size ratio width/length=20 $\mu$m/20 $\mu$m. With the transistor types used in FIG. 13, one obtains at node $V_{S1}$, a voltage of 0.49V with transistors of the FD-SOI CMOS process previously mentioned. This voltage is the gate voltage for the next stage. The formula for the relationship between the voltages, with $V_{G0}=-0.32$ for P1 doping level, leads to a voltage reference $V_{S2}$ value of $(V_{S1}-V_{G0})/1.08$, i.e. 0.75 V.

If the second stage of FIG. 13 were to have the P2 doping level, then $V_{S2}$ would be lower than $V_{S1}$ (as $V_{G0}$ is larger in that case, as can be seen in FIG. 4). In all cases of basic cells with different doping levels being cascaded, it has to be verified that all the transistors remain saturated.

Such cascade of basic cells also allows addition of a temperature dependence of each basic cell in order to increase the sensitivity of the output voltage versus a temperature variation by using basic cells with different size ratios.

Figure 14:
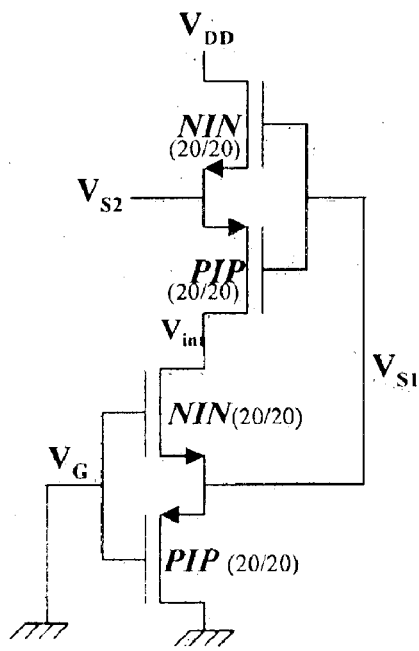
FIG. 14 is a schematic representation of an embodiment of vertically cascaded basic cells with common gate.

Another possibility for cascading basic cells is a vertical cascading, as illustrated in FIG. 14, where two basic intrinsic cells with common gate are vertically cascaded. In the embodiment described, all transistors have the same size ratio width/length=20 $\mu$m/20 $\mu$m. The drain of the n-MOS transistor of the first basic cell is connected to the drain of the p-MOS transistor of the second basic cell. The output node $V_{S1}$ of the first basic cell is connected to the common gate of the second basic cell.

This way of vertically cascading basic cells allows to reduce the current consumption but gives less freedom on the doping levels (in order for all the transistors to remain saturated).

Diode

Diode like characteristics are required in some typical applications, such as charge pump voltage multipliers or rectifiers.

Figure 15:
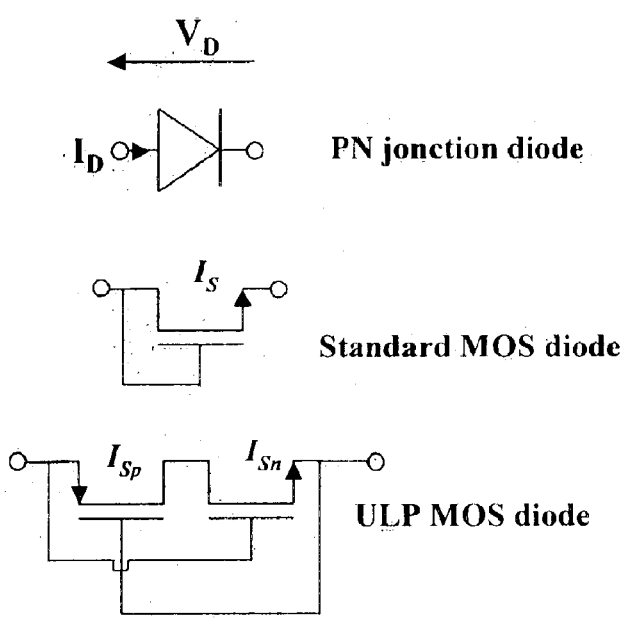
FIG. 15 is a schematic representation of different implementations of a diode: a pn-junction, a standard MOS diode and an ULP diode according to the present invention.

FIG. 15 shows different implementations of diodes. The first diode mentioned is a conventional pn-junction diode. The second diode mentioned is a prior art MOS diode architecture, which is a MOSFET with its gate connected to its drain. $I_S$ is the saturation current for the standard MOS diode (n or p-MOS).

The third diode mentioned is a diode according to an embodiment of the present invention. $I_{Sn}$ and $I_{Sp}$ are respectively the saturation current for the n- and p-MOS device of the new diode. Based on the weak inversion relation (eq. 1) between current and voltage, the following new diode equivalent characteristic is obtained:

$$I_{D_{ULP}} = I_{Sn} \cdot e^{\frac{V_D}{nU_T}} \cdot \frac{1 + \frac{I_{Sp}}{I_{Sn}} - \sqrt{\left(1 - \frac{I_{Sp}}{I_{Sn}}\right)^2 + 4\frac{I_{Sp}}{I_{Sn}} \cdot e^{-\frac{V_D}{nU_T}}}}{2} \quad \text{(eq. 3)}$$

In the case of symmetrical threshold voltage for n- and p-MOS (i.e. $I_{Sn}=I_{Sp}$), this expression simplifies to:

$$I_{D_{ULP\,Sym}} = I_{Sn} \cdot \left(e^{\frac{V_D}{nU_T}} - e^{\frac{V_D}{2nU_T}}\right)$$

Figure 16A:
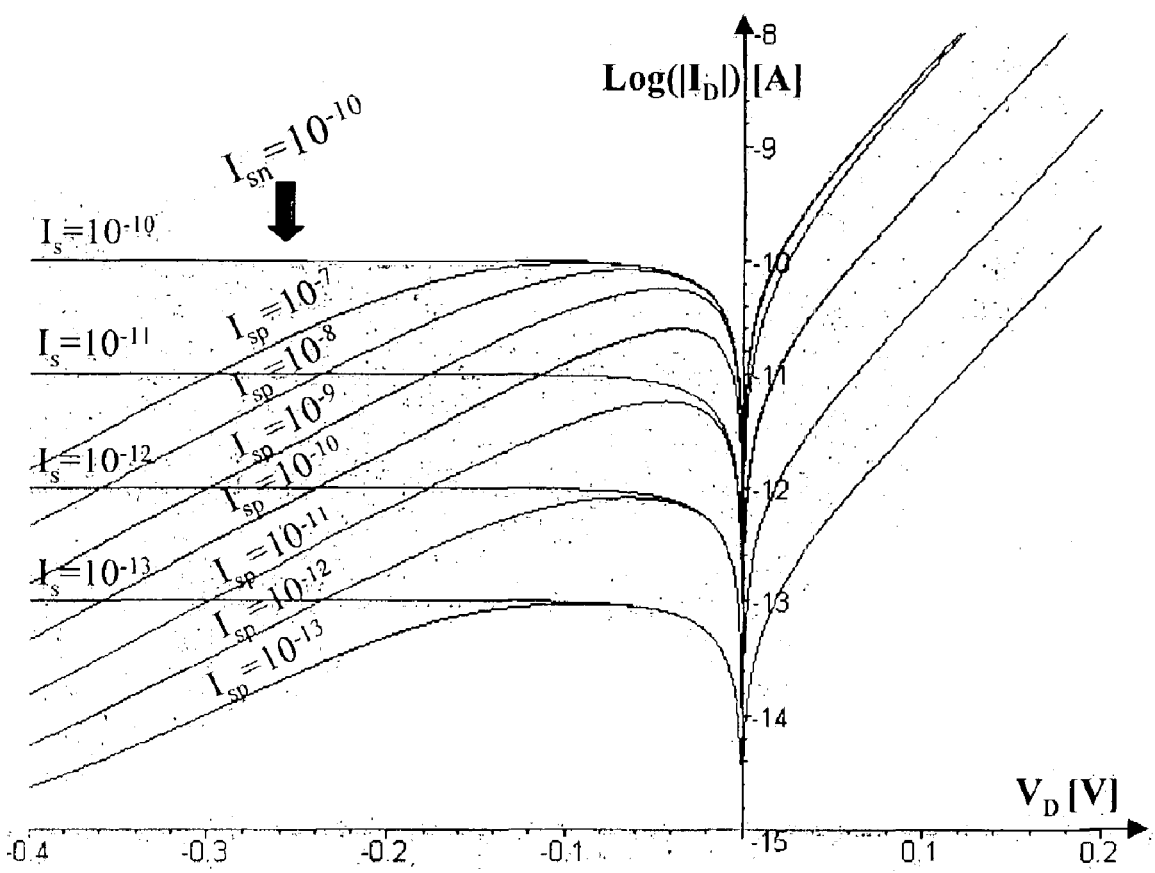
FIG. 16a is a logarithmic graph of the diode characteristics of a prior art MOS diode and a ULP diode according to the present invention.

Eq. 3 is plotted on FIG. 16a and is compared to the standard diode relation $$I_D = I_S \left(e^{\frac{V_D}{nU_T}} - 1\right)$$

For the comparison, $I_{Sn}$ has been fixed to $10^{-10}$ A while $I_{Sp}$ and $I_S$ are scanned. It can be concluded for the ULP diode that the MOS device presenting the lowest saturation current will limit the forward current to the current of the standard diode implemented with the same (low) $I_S$ current. Compared to standard MOS diode, the new ULP diode presents virtually no reverse current when reversibly biased by a few hundreds of millivolts. For higher temperatures, all saturation currents (ISn, ISp and IS) will increase, but the reverse current of the new ULP diode will always remain much lower than the standard MOS diode. In order to implement a diode with a predefined characteristic, a set of n- and p-MOSFETs has to be selected from FIG. 4.

Figure 16B:
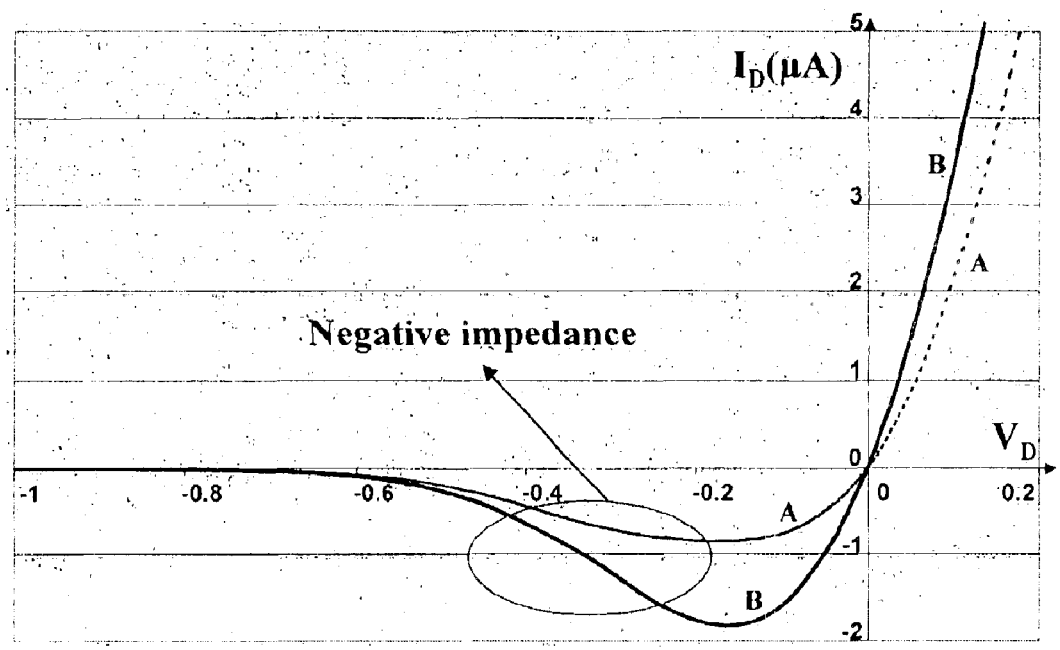
FIG. 16b is a graph of the diode current of an ULP diode on a linear scale.

If the diode current curve is set out on a linear scale, a plot as in FIG. 16b is obtained. As can be seen from FIG. 16b, in forward bias a normal diode characteristic is obtained. In the reverse biased mode the current starts from zero at the origin and reaches a maximum. With larger voltages in reverse mode the slope goes negative. Therefore, in some voltage range of the reversed biased diode, a negative diode impedance is obtained. This negative impedance means that, for slightly reverse currents, there are two different possible stable voltages. This is advantageous in memory devices—for example, an SRAM device that uses 2 ULP devices of the present invention is always biased in reverse.

Voltage Multiplier

Figure 17:
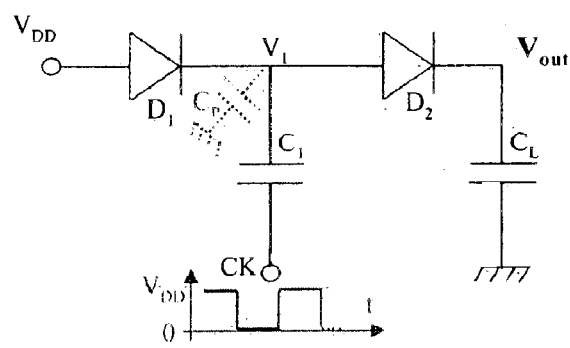
FIG. 17 is a schematic representation of a basic architecture of a charge pump voltage doubler.

The basic architecture of a charge pump voltage doubler is given in FIG. 17. It comprises two diodes, $D_1$ and $D_2$, coupled in series between a voltage source $V_{DD}$ and a load capacitance $C_L$ (usually a MOSFET gate). At the node between both diodes $D_1$ and $D_2$, a capacitance $C_1$ is connected, which is connected with its other node to a clock CK, which is a step function switching between $V_{DD}$ and 0 V. $V_{out}$ is the voltage over the load capacitance $C_L$.

Figure 18:
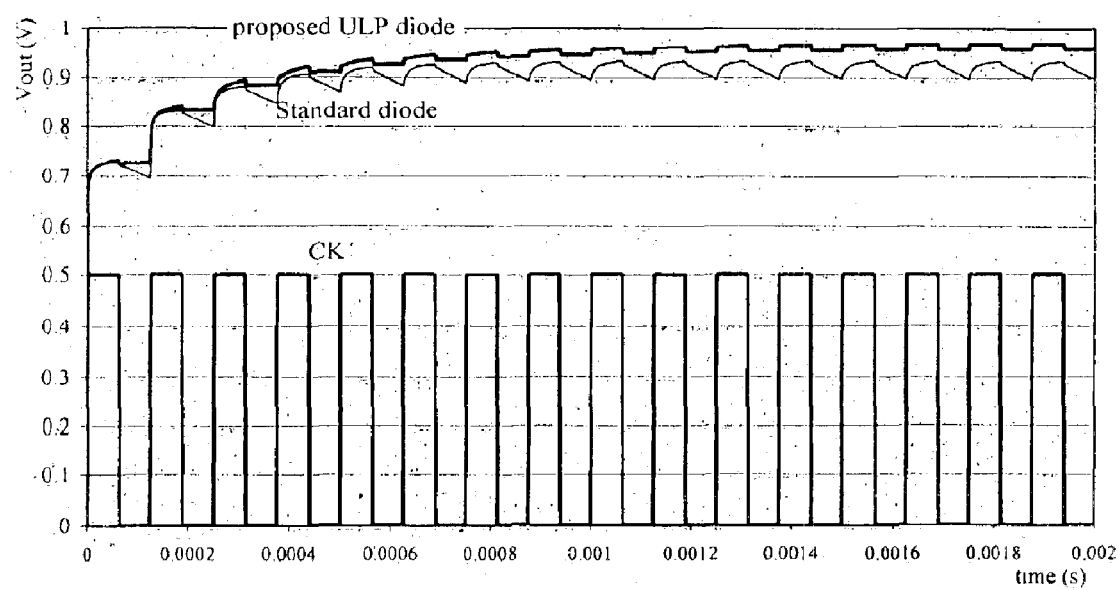
FIG. 18 is a transient simulation of a voltage doubler using a standard diode (lower curve with large ripples) and using the new proposed ULP diode (upper curve).

If both diodes $D_1$ and $D_2$ are standard n-MOS diodes, then after a transient period, the output voltage on the load capacitance $C_L$ is expected to be $2 \cdot V_{DD}$. However, due to losses, $V_{out}$ is lower than $2 \cdot V_{DD}$ and presents ripples, as can be seen on FIG. 18. After the transient period, voltage $V_1$ is basically the input clock signal clamped to $V_{DD}$. This means that the diode $D_1$ is polarised either with a voltage close to 0 or to a negative voltage ($-V_{DD}$). When $D_1$ is reverse biased, capacitor $C_1$ slightly discharges due to the diode reverse leakage current. Similar conclusions can be found for the output diode $D_2$. As has been intuitively explained, after a transient period, diodes are no longer strongly biased. This means that forward currents are very small. In fact, these MOS diodes work only in weak inversion for such current level. It is to be noted that all previous considerations are valid only for a capacitive load at the output voltage (a resistive load would lead to higher forward current peaks in diodes). The usual concept of "diode threshold" has no significance anymore in the present case. Considering the following MOS diode current-voltage relation in weak inversion, $$I_D = I_S \left(e^{\frac{V_D}{nU_T}} - 1\right)$$

the critical parameter is $I_S$, the saturation current which depends on the channel doping level and on the MOS diode size. During the steady state, at each moment, either diode $D_1$ or $D_2$ is reverse biased by approximately $V_{DD}$. The corresponding reverse current corresponds to energy loss on each clock cycle. During the other half clock period, the output capacitance is charged through diode $D_2$ in order to compensate previous mentioned loss. After the charge transfer from $C_1$ to $C_L$, half the energy is lost by the corresponding loop impedance, whatever the impedance value. The impedance will only affect the charge transfer speed.

For a fixed clock frequency, during the clock high level, the amount of charge transferred from $C_1$ to $C_L$ will increase if $I_S$ is high (i.e. lower diode impedance). Comparing the steady state output voltage, it is slightly higher for high saturation current values. The reason is that the charge transfer from $C_1$ to $C_L$ is more effective for higher saturation current, i.e. for lower impedance. The non-transferred charge can be considered as a loss that will limit the output voltage value. On the other hand, higher $I_S$ means higher leakage current. This is clearly shown on FIG. 18 where the output voltage in case of the use of a standard diode linearly decreases when the clock level is low. Another energy loss source is related to the parasitic capacitance ($C_P$) to ground at the common node between both diodes. When the clock voltage increases by $V_{DD}$, the internal node only increases by $(V_{DD}.C_1)/(C_1+C_P)$. The theoretical maximum output voltage is therefore $$V_{DD}\left(1 + \frac{C_1}{C_1 + C_P}\right)$$

This means that the MOS diodes should be as small as possible in order to minimise $C_P$. It can be concluded that, for prior art CMOS diodes, the output voltage value is close to optimum with a short settling time if the saturation current $I_S$ is high and if the diode capacitance to ground is small. This however is achieved at the cost of a large ripple on the output voltage.

If an ULP diode according to embodiments of the present invention (as represented, for example, in FIG. 15) is used for each of the diodes D1 and D2 in the voltage doubler of FIG. 17, then these diodes present virtually no reverse current when reversed biased by a few hundreds of millivolts, as already explained with reference to FIG. 16. Almost no reverse current means almost no energy loss, which can be seen from the upper curve of FIG. 18. The residual square ripple observed in FIG. 18 with the ULP diode is only due to capacitive couplings. The advantage of the proposed ULP diode is thus clear for such application. It is to be noted that with the diode according to the present invention, only one clock edge is necessary to obtain an output voltage of 1.5 $V_{DD}$ on a load capacitance equal to the internal capacitance $C_1$ and that this voltage can be held for a while without other clock rising edge thanks to the very small reverse leakage current. If $C_1$ is higher than $C_L$, then values close to 2 $V_{DD}$ can be obtained.

ULP Memory Cells

Figure 19:
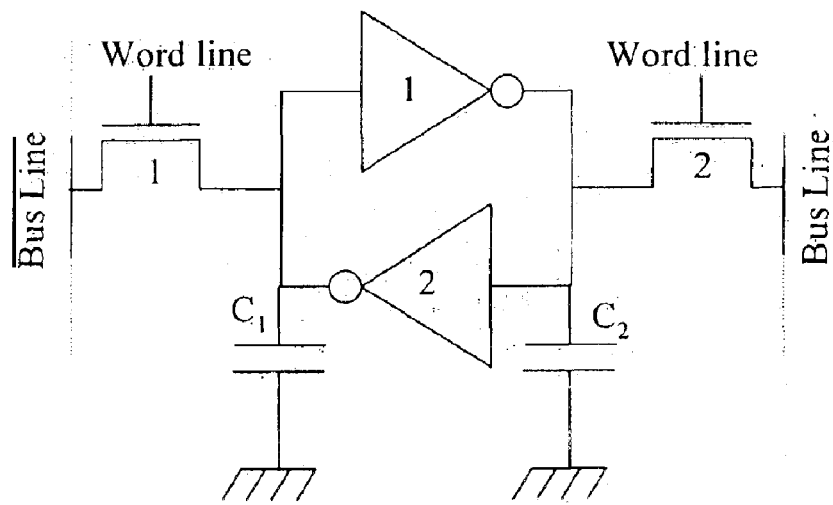
FIG. 19 is a prior art architecture of a RAM memory cell.

An important basic block in digital circuits is the static memory, used for example in random access memories (RAM). The simplest way to implement such static memory is to use two cross-coupled inverters with the input of one being the output of the other one. Two pass transistors, Word_line$_1$ and Word_line$_2$ are used to symmetrically impose the static memory steady state (i.e. write 1 or 0). This is represented in FIG. 19.

The static consumption of such basic cell is due to the off-state current of each inverter, i.e. drain to source current when the gate to source voltage is zero. This value depends on MOSFET threshold voltages. Besides the static consumption, there also exists a transient consumption. This last power loss is due to the current flowing through both inverters when they change their states. A second loss during the write transient is due to the fact that in order to change the state of the memory, the driver which has to change the state of the memory has to be "stronger" than both inverters of the memory cell whereas during the "read" operation, the inverters must be strong enough to drive the bus lines.

Figure 20:
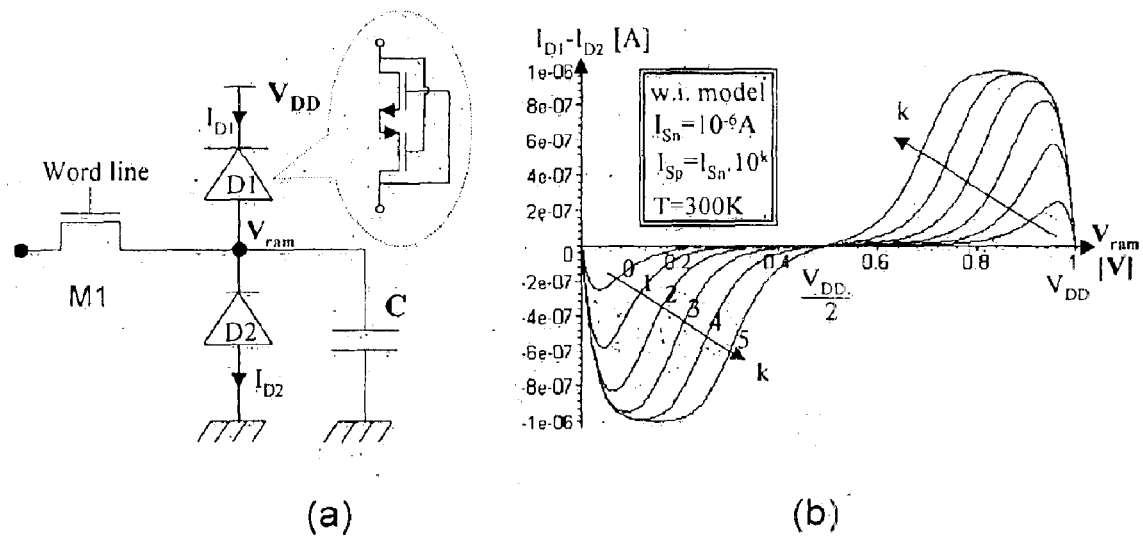
FIG. 20(a) is a new architecture of a RAM memory cell based on the ULP diode according to the present invention.
FIG. 20(b) is a graph of the current difference between the upper and the lower ULP diode of the memory cell in function of the voltage level of the memory cell in case of supply voltage $V_{DD}$=1 Volt.

A first embodiment of a memory cell according to the present invention is based on the ULP diode previously introduced. FIG. 20(*a*) represents the basic ULP memory cell architecture according to the first embodiment of present invention. This architecture is a 1 bit 5T (5 transistor) memory cell. FIG. 20(*b*) represents the current difference between the upper and the lower ULP diodes ($D_1$ and $D_2$) respectively versus the voltage level ($V_{ram}$) of the memory cell. The plotted current difference is based on the weak inversion (wi) relation only. As can be observed on this plot, when $V_{ram}$ is below $V_{DD}/2$, the current difference $I_{D1}-I_{D2}$ is negative. This means that the node capacitance C will be discharged down to a value close to zero volt. If $V_{ram}$ is above $V_{DD}/2$, the node will be charged up to a value close to $V_{DD}$ (because $I_{D1}-I_{D2}$ is positive). Such an architecture is therefore auto-regenerative for both logical levels "0" and "1". The main advantage is the absence of a feedback loop, as for the standard architecture of FIG. 19. Furthermore, the static current consumption of the architecture according to the present invention is lower than the usual one (FIG. 19). In a stable logic state, the transistors of the reverse biased ULP diodes are indeed biased with low drain-to-source voltage and negative gate-to-source voltage in very weak inversion while the drain-to-source voltage is high and the minimum gate-to-source voltage is 0V in a standard memory cell (FIG. 19).

The regeneration current level of the memory cell architecture according to this embodiment of the present invention depends on saturation currents ($I_S$), i.e. on the threshold voltage of both n- and p-MOSFETs. In order to increase immunity to various noises, it is better to use n-MOSFETs with threshold voltages close to zero or even negative and p-MOSFETs with threshold voltages close to zero or even positive. If thresholds are symmetrical, this corresponds to k=0 on FIG. 20(*b*). In order to increase immunity to noises, it is preferable to provide some asymmetry on thresholds as shown on the same figure for increasing k values (increasing k by one corresponds to an asymmetry in threshold voltages of about 70 mV at room temperature; k is a numeric representation of the disymmetry between n-MOSFET and p-MOSFETs threshold voltage of FIG. 4).

Compared to a standard RAM architecture, the memory cell architecture according to this embodiment of the present invention is not suited for high voltage supply. Indeed, in such cases the regeneration current becomes very small when $V_{ram}$ is close to $V_{DD}/2$ as can be seen on FIG. 21, where the regeneration current is given in function of the voltage level of the memory cell in case the supply voltage $V_{DD}$ equals 2 Volts.

Figure 21:
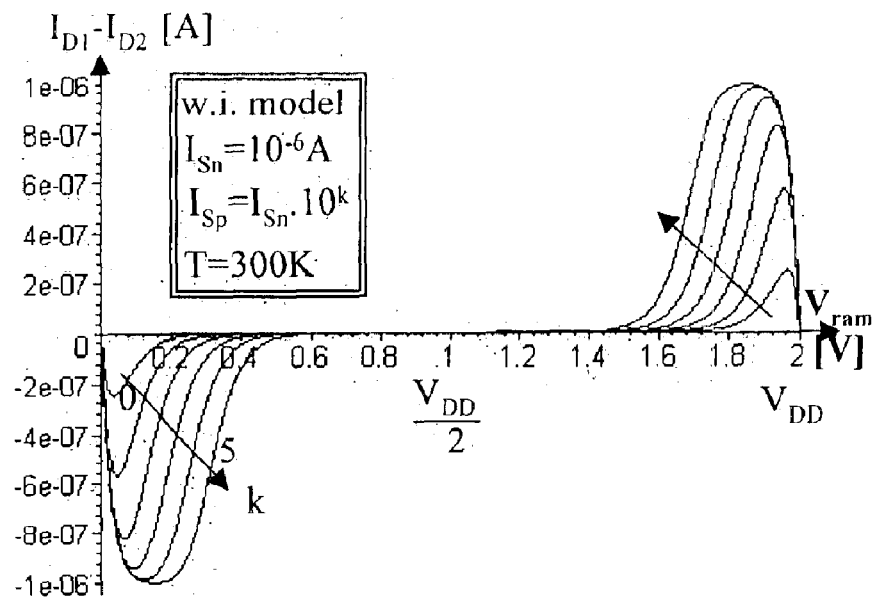
FIG. 21 is a graph of the regeneration current of a memory cell according to the present invention in case of supply voltage $V_{DD}$=2 Volts.

It is to be noted that if moderate and strong inversion regimes were considered in the model, the regeneration current would stay important on a wider voltage range than the range depicted on FIG. 21. A wider voltage range for the regeneration current is also obtained when the temperature increases, while keeping a lower static consumption than standard architecture based on inverters.

On the other hand, the lower supply voltage limit has to be higher than two times the diode voltage corresponding to the higher reverse current. Depending on the parameter k, this ULP memory cell can work down to 0.5 V of supply voltage. It is to be noted that decreasing the supply voltage means increasing the ULP memory cell consumption, as ULP diodes are not strongly reverse biased.

The new memory cell architecture according to this embodiment presents significant advantages (consumption and speed) compared to standard architectures for low voltage and/or high temperature RAM. The architecture combines the self-regeneration property of a SRAM with the low memory node capacitance and low power consumption of a DRAM. While no information refresh is needed during storing thanks to the autoregenerative behaviour of the new memory cell which makes the cell resistant to noise and leakage, information refresh may be needed after reading.

This basic memory cell according to the first embodiment of the memory cells of the present invention, associated with pass gates, can also be used for other digital circuits, such as D and master-slave flip-flops.

A ULP memory cell according to an embodiment of the present invention can find many applications in digital circuits where information on high impedance floating nodes has to be stored. In prior art implementations of digital circuits, this information is only valid during limited time, since such node can be affected by leakage currents, noise, etc. and the information lost. The ULP cell according to an embodiment of the present invention appears as an elegant way to keep the logic level at limited speed or power penalty.

Figure 27:
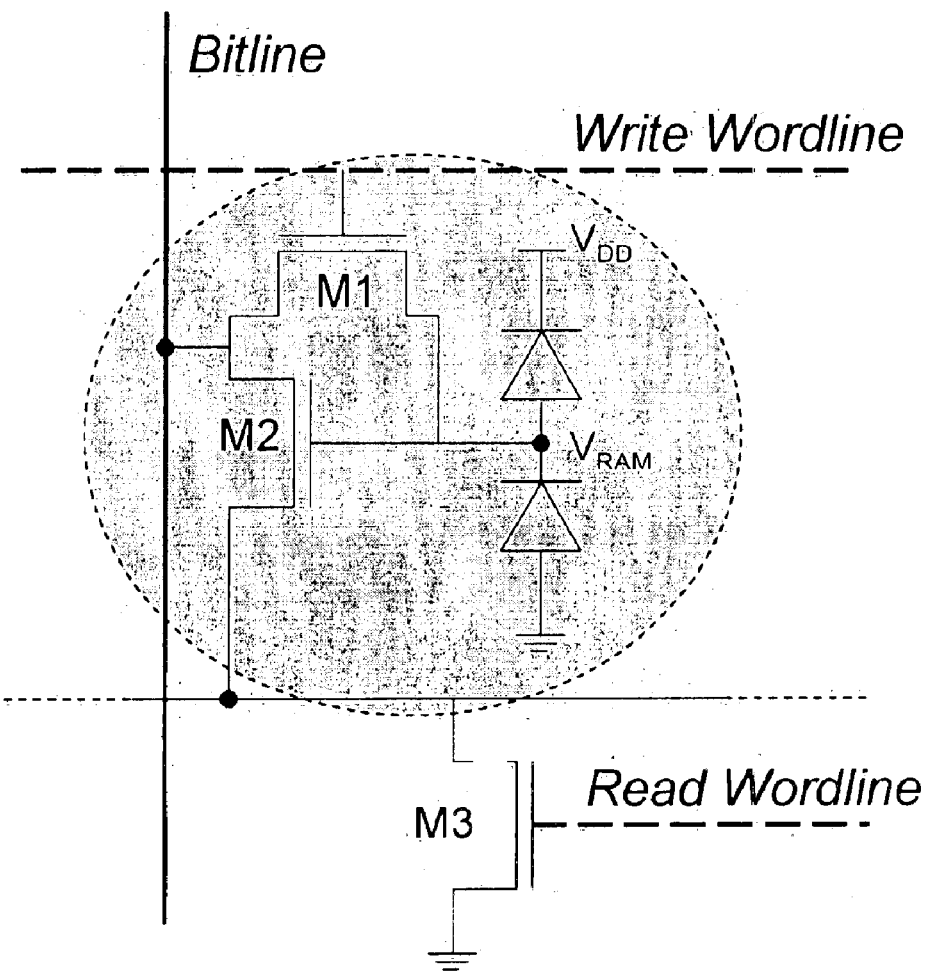
FIG. 27 illustrates a 1-bit, 6T SRAM cell according to an embodiment of the present invention.

A second embodiment of a memory architecture according to the present invention is illustrated in FIG. 27. This structure is a 1-bit, 6T SRAM-like architecture. Contrary to the memory cell of FIG. 20(a), the 6T SRAM-like architecture doesn't need any information refresh after read operation. The memory cell as represented in FIG. 20 with access transistor M1 is used, and a further transistor M2 is added, which is connected with its drain electrode to the Bitline, and of which the gate electrode is connected to the interconnection point between the two ULP diodes, where the voltage level ($V_{RAM}$) of the memory cell can be found. The source electrode of the added transistor M2 is connected to the drain electrode of a read-out transistor M3, of which the gate is connected to a Read Wordline. The write process is controlled by the Write Wordline that allows to connect the Bitline to the memorisation node $V_{RAM}$ through access transistor M1 (Read-out transistor M3 being cut off by low Read Wordline voltage level). The read operation is performed by activating the Read Wordline to a high voltage level and connecting the source electrode of M2 to ground. Depending on whether the memorisation node voltage $V_{RAM}$ is high or low, a current will flow through M2. This current indicates which information is stored in the memory cell. Thanks to this reading scheme, information on the memorization node ($V_{RAM}$) is not degraded during reading operation and no refresh operation is needed. This embodiment presents thus the same functionality than a standard SRAM cell. The static current consumption of this architecture according to the second embodiment of the present invention is lower than the usual one (FIG. 19) because in a stable logic state, the transistors of the reverse biased ULP diodes are indeed biased with low drain-to-source voltage and negative gate-to-source voltage in very weak inversion while the drain-to-source voltage is high and the minimum gate-to-source voltage is 0V in a standard memory cell (FIG. 19).

Furthermore, the memory architecture described with respect to FIG. 27 has a high temperature resistance: the memory cell can keep its content up to 300° C. It can be used as stand-alone RAM or as embedded RAM.

Figure 28:
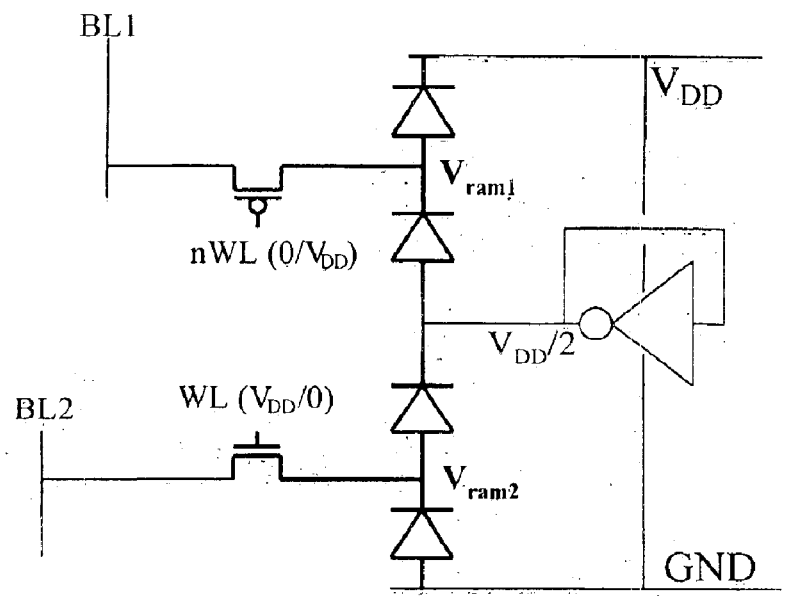
FIG. 28 illustrates a 2-bit, 2*5T DRAM cell according to an embodiment of the present invention.
Figure 29:
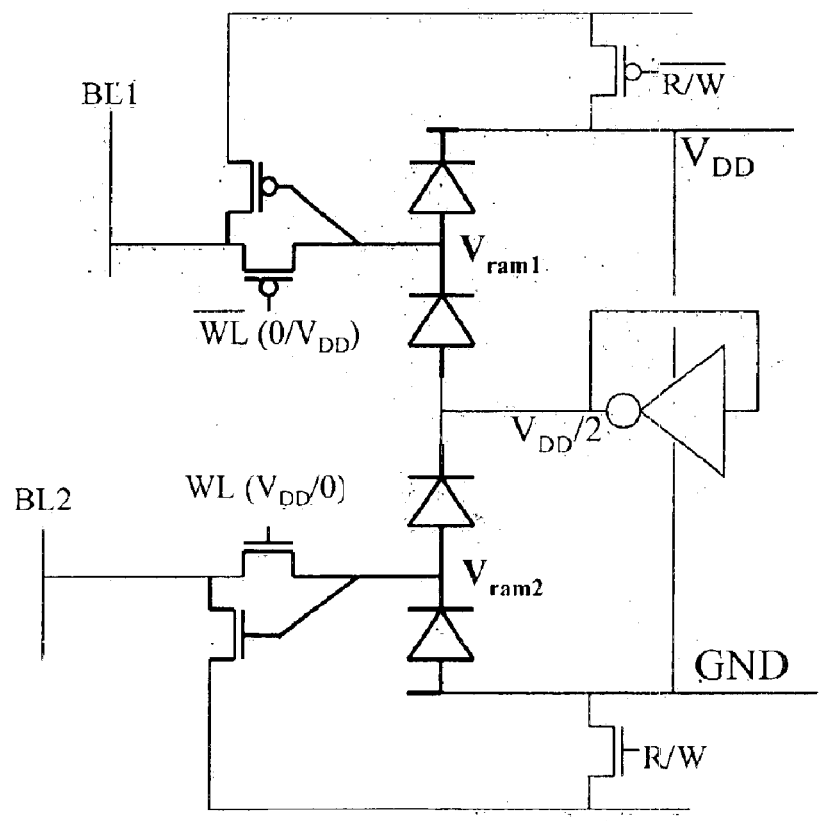
FIG. 29 illustrates a 2-bit, 2*6T SRAM cell according to an embodiment of the present invention.

A third and a fourth embodiment of a memory architecture according to the present invention are illustrated in FIG. 28 and FIG. 29 respectively, which show a 2 bits, 2*5T DRAM-like architecture and a 2-bits, 2*6T SRAM-like architecture respectively.

In the configurations shown in FIG. 28 and FIG. 29, two memory cells as in FIG. 20 resp. as in FIG. 27 are connected in series between the high and low supply voltages, VDD and GND respectively, leading to a "2 bits memory cell". The 'high' memory cell is accessed by a PMOS access transistor while the 'low' cell is accessed by an NMOS access transistor. A "half-$V_{DD}$" generator fixes the common node between the 'high' memory cell and the 'low' memory cell to $V_{DD}/2$. This "half-$V_{DD}$" generator is common to a plurality of cells. By doing so, the use of a charge pump is avoided, which is usually needed in DRAM to boost the Word Line WL signal level above $V_{DD}$ to eliminate the voltage drop in the cell due to the threshold voltage $V_t$ and body effect of the access transistor. The signal on WL (resp. $\overline{WL}$) is indeed at least $V_{DD}/2$ higher (resp. lower) than the maximum (resp. minimum) memory node level $V_{ram2}$ ($V_{ram1}$). It is to be noted that this allows to choose high-Vt access transistors as needed by the ULP cell in order to have an access transistor leakage lower than the cell intrinsic current.

Another advantage is that the static current consumption is shared by the two ULP memory cells shown in the drawing. The additive power consumed by the $V_{DD}/2$ reference can be made negligible (as it is shared for all memory cells), reducing the total static power consumption by a factor close to 2 with regards to the parallel combination of 2 memory cells supplied at $V_{DD}$.

Dynamic Logic

Figure 30:
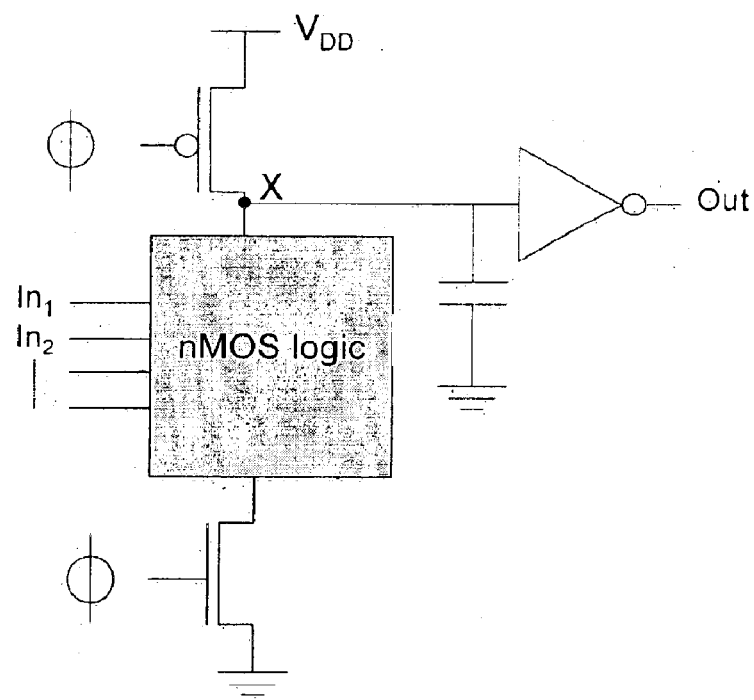
FIG. 30 illustrates the basic principle of domino logic.

The ULP memory cell according to an embodiment of the present invention can find applications in Dynamic Circuits, such as Pre-charge-Evaluation Logic or Domino Logic. The principle of this kind of logic is represented in FIG. 30. The logic operation is divided in two phases: a pre-charge phase and an evaluation phase. During the pre-charge phase (Φ low), node x is pre-charged to $V_{DD}$ by the pMOS charging transistor. During the evaluation phase (Φ high), the pMOS charging transistor is cut off and the bottom nMOS transistor is switched on. If there is a discharging path in the nMOS logic, x will be discharged, otherwise it will stay at $V_{DD}$. The inverter at the output is necessary to ensure stable operation when cascading blocks. Domino logic leads to more compact layout than static CMOS and is well suited for high-speed arithmetic circuits. It is therefore intensively used in very fast arithmetic and logic units (ALUs).

Domino logic, however, presents two major reliability problems, due to the x node which is floating during the evaluation phase: charge problems and noise problems:

Charge leakage: leakage current of the pMOS charging transistor can discharge the x node and provide wrong logic states.

Charge sharing: transitions in the input signal $In_1$ or $In_2$ during the evaluation phase can lead to charge sharing between internal capacitances of different elements and degrades the x level.

Noise immunity: the high impedance floating x-node makes domino logic very sensitive to noise sources, and it is a non-restoring logic.

Figure 31:
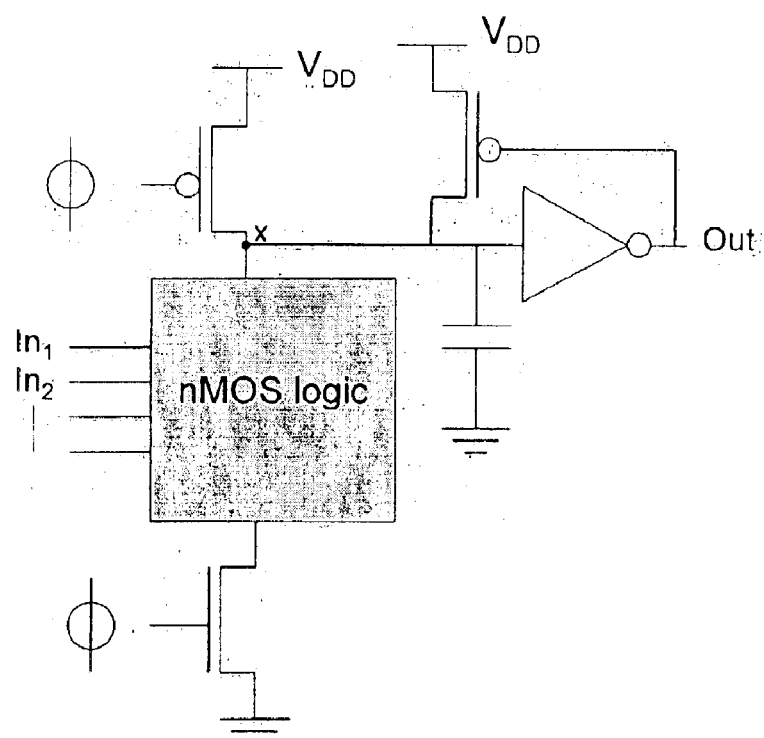
FIG. 31 illustrates conventional domino logic with a pMOS keeper element.
Figure 32:
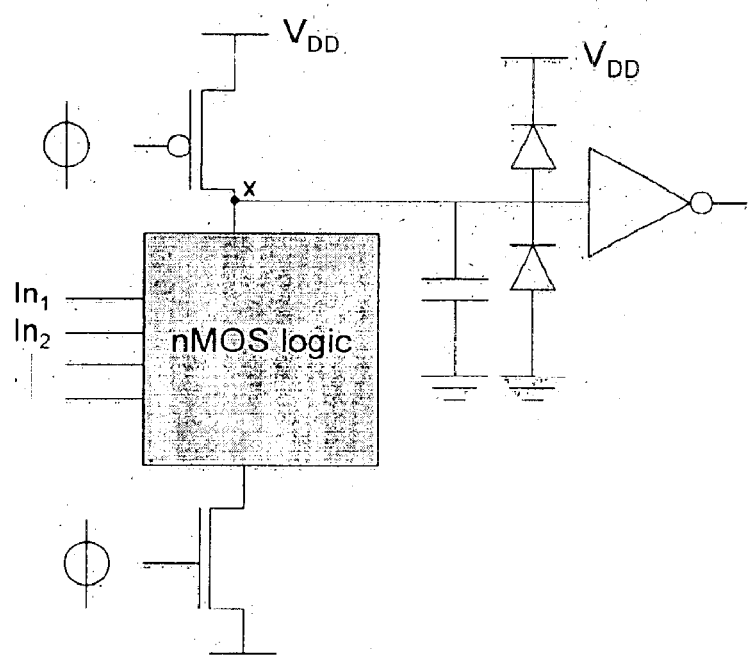
FIG. 32 illustrates domino logic with a ULP keeper element according to an embodiment of the present invention.

The conventional solution to these problems is to use a level holder or keeper element, as illustrated by the pMOS transistor in FIG. 31. However, this keeper element adds extra dynamic power consumption during the evaluation phase. Moreover it slightly increases the evaluation time due to the positive feedback that the nMOS logic has to fight to discharge node x to zero. Another problem is that when x is at "0", the pMOS keeper (FIG. 31) will provide a leakage current ($V_{DS}=V_{DD}$, $V_{GS}=0V$) leading to static power dissipation. According to an embodiment of the present invention, it is proposed to use the ULP memory cell according to the present invention as keeper element or level holder in dynamic circuits, as illustrated in FIG. 32. It solves the problem linked to the floating x node while adding only negligible power consumption. It can be seen as a general way of transforming dynamic circuits into static circuits while keeping the "Dynamic" advantages, i.e. high speed. The regeneration current of the ULP cell that the nMOS logic has to fight to discharge node x to zero is much lower than the one provided by a simple pMOS keeper as in FIG. 31, adding almost no speed penalty. This comes however at the price of a lower immunity to input signals noise. Finally, the static dissipation when x is at 0 will be reduced by orders of magnitude compared to the conventional pMOS keeper case.

Pass Gate Logic

Figure 33:
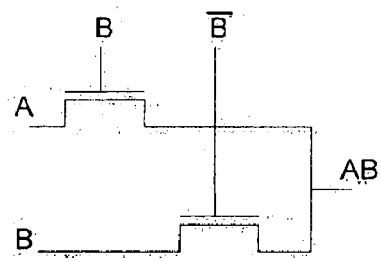
FIG. 33 illustrates a conventional AND gate in pass gate logic.
Figure 34:
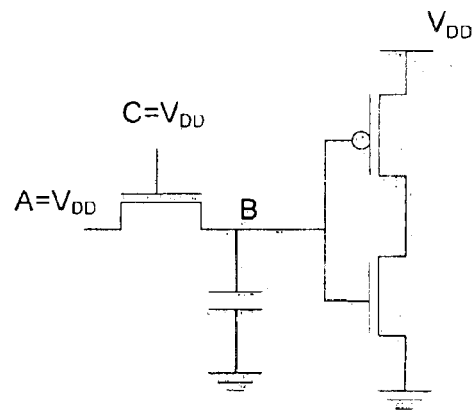
FIG. 34 illustrates a conventional switch in pass gate logic.
Figure 35:
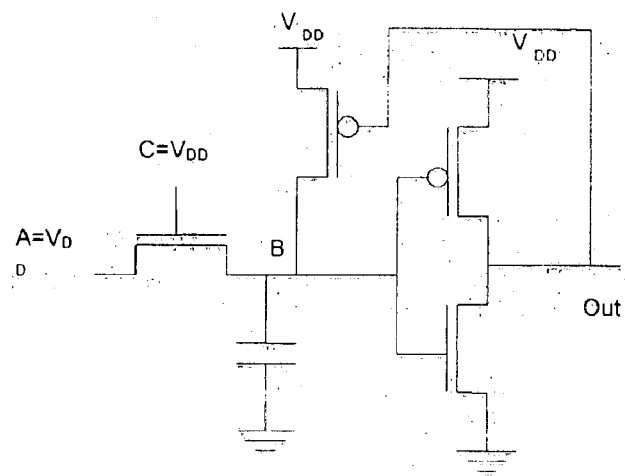
FIG. 35 illustrates a conventional pass gate logic switch with a level restoring transistor.
Figure 36:
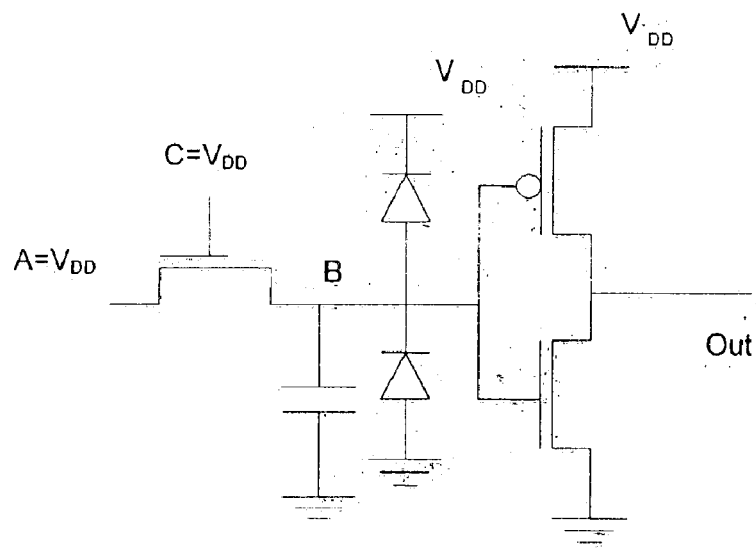
FIG. 36 illustrates a pass gate logic switch with a ULP memory cell as level restoring means, according to an embodiment of the present invention.

Pass gate logic implements logic functions using a logic network of pass transistors (switches); for example a conventional AND gate in pass gate logic, e.g. complementary pass-transistor logic, is illustrated in FIG. 33. Again, the presence of high impedance floating nodes makes this kind of logic very sensitive to noise. Moreover, as can be seen from FIG. 34, which illustrates a switch in pass logic, due to the non-zero threshold voltage and the body effect of the pass transistor, the voltage $V_B$ at node B does not pull up to $V_{DD}$, but only to $V_{DD}-V_{Tn}$. $V_{Tn}$ is the threshold voltage of the pass transistor and $V_{Tn}$, which is increased due to body effect. This decreases noise margin and increases static power dissipation. Similarly to Domino logic, a level restorer can be used, typically implemented by means of a pMOS transistor as illustrated in FIG. 35. However, this increases the rise time of the inverter due to the fight between the switches and the level restorer when it is desired to discharge node B, which also increases the dynamic power consumption. The ULP cell according to an embodiment of the present invention, as explained above, can play the role of the keeper on node B, as illustrated in FIG. 36. This way, node B is not floating anymore, thus the pass gate logic becomes more resistant to noise and leakage, with only a negligible extra power consumption.

D Latch

Figure 37:
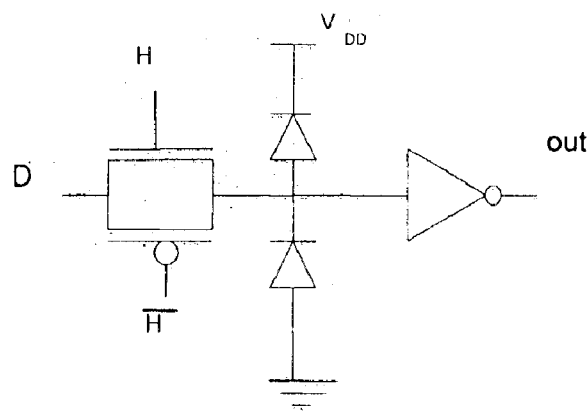
FIG. 37 illustrates a D latch using a ULP memory cell according to an embodiment of the present invention.

FIG. 37 shows the implementation of a data latch, generally called D latch, using an ULP memory cell according to an embodiment of the present invention. This circuit stores the input level D when H is high, no matter how the input level D changes. When H is low, the memory point keeps the information of the last state of the D input regardless of the changes of the D level, for use by whatever other circuits that may need this signal, until H comes back to the high-level.

Figure 38:
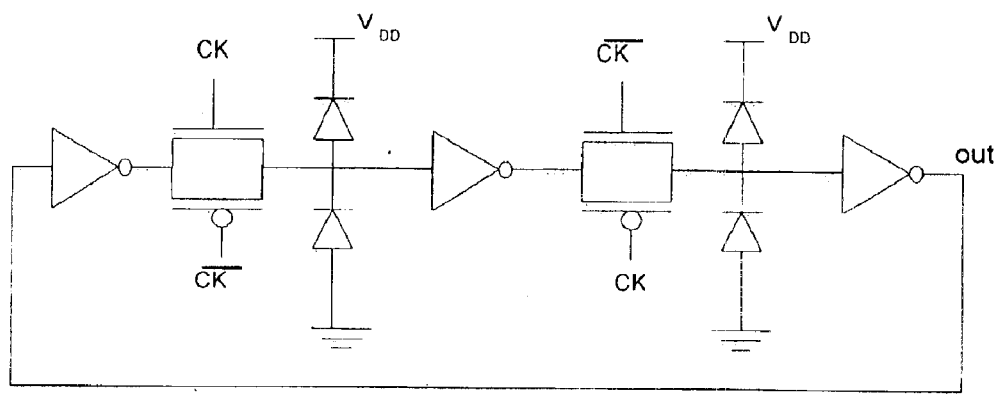
FIG. 38 illustrates the use of a D-latch cell of FIG. 37 in a frequency divider.
Figure 39:
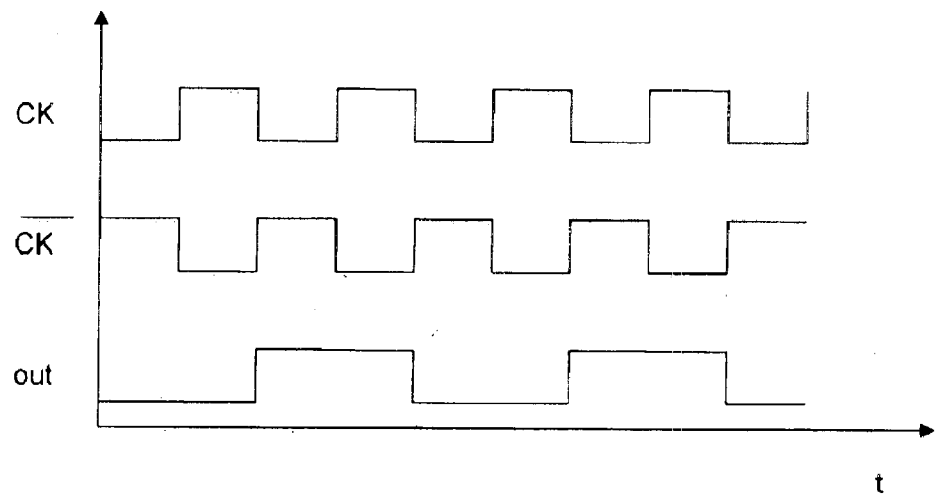
FIG. 39 illustrates the frequency output of the frequency divider of FIG. 38 in function of the clock input CK and inverse clock input $\overline{CK}$.

FIG. 38 shows a possible use of the D latch according to an embodiment of the present invention in a frequency divider. The signal at output node presents a frequency equal to the half of that of the complementary input clock signals CK and $\overline{CK}$, as illustrated in FIG. 39. The D latch cell according to an embodiment of the present invention allows to keep the signal on floating nodes, increasing robustness to noise and leakage of the system contrary to the standard implementation without an ULP cell according to the present invention. It is to be noted that a frequency divider according to an embodiment of the present invention, as illustrated in FIG. 10, can deal with a wide range of input frequencies whereas the standard implementation does not work below a frequency defined by the leakage currents, due to the loss of information on the floating nodes.

Level Keeper in MTCMOS Circuits

Figure 40:
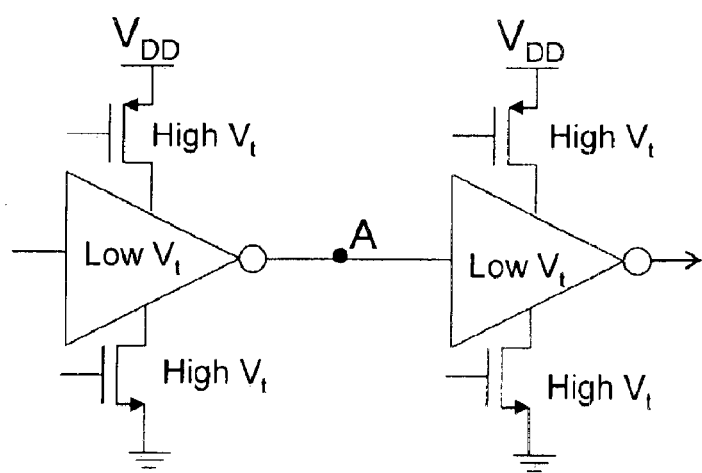
FIG. 40 schematically illustrates the basic principles of an MTCMOS circuit.

Multi-treshold CMOS (MTCMOS) is an increasingly popular circuit technique that enables high performance and low power operation, but requires sequential circuit structures that can retain state during standby modes. A well-known technique In order to reduce overall power consumption is scaling of supply voltages. However, to maintain performance, device threshold voltages must scale as well, which will cause subthreshold leakage currents to increase exponentially. It has been proposed to face the static dissipation increase that results from the scaling of $V_t$ with $V_{DD}$, by utilising high $V_t$ sleep devices to gate the power supplies of a low $V_t$ logic block (FIG. 40). By doing so, data on the floating circuit nodes (for example node A in FIG. 40) are lost during standby which is unacceptable in some cases. Proposed solutions to face this problem are quite heavy to implement as they need additional control signals and switches.

Figure 41:
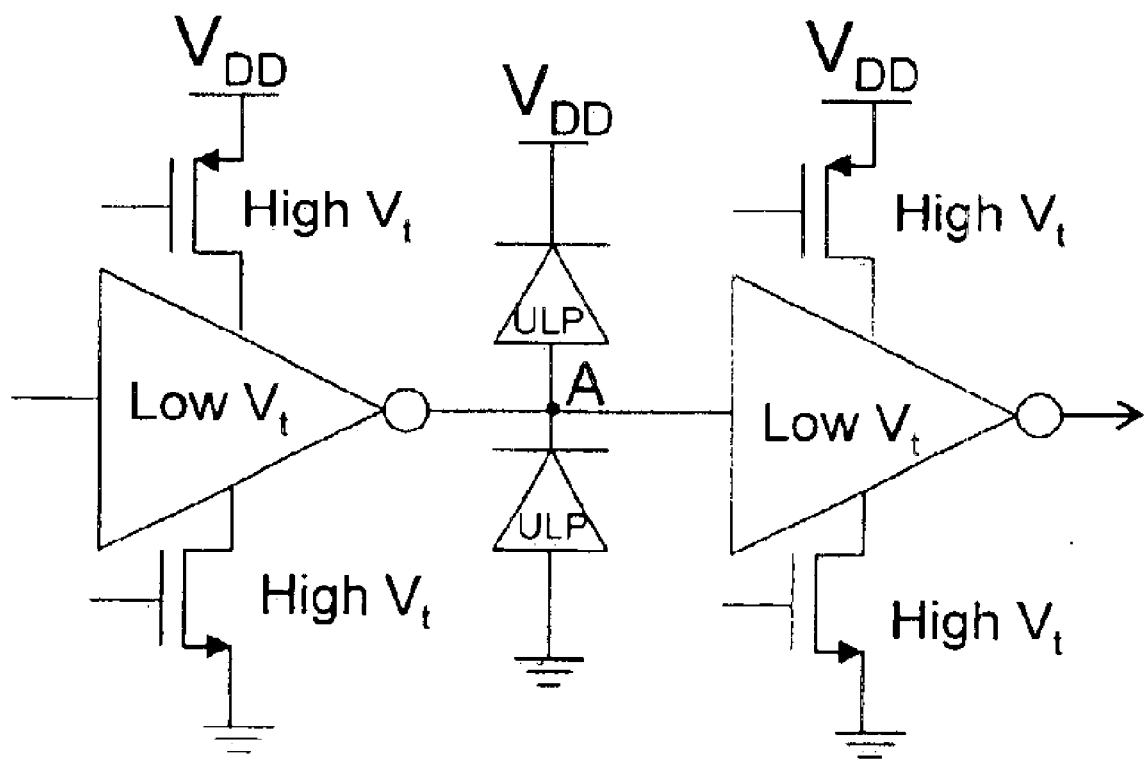
FIG. 41 illustrates an MTCMOS circuit in which a ULP memory cell has been used as a level keeper device.

According to an embodiment of the present invention, it is proposed to use the new ULP memory cell as a level keeper, as illustrated in FIG. 41. When introduced in a MTCMOS scheme to save data on node A during standby state, the new ULP memory cell leads to an ultra low static consumption. Almost no speed penalty is observed in active mode since the input capacitance of the cell is about the gate oxide capacitance of one MOS device of the ULP diodes only. Moreover, the positive feedback introduced by the memory cell is easily fought by the preceding low-$V_t$ logic stage to change node A logic state.

ESD Protection

Electrostatic Discharge (ESD) protection is a key element for industrial processes. An electrostatic discharge is a transfer of electrostatic charge between two bodies at different electrostatic potentials caused by direct contact or induced by an electrostatic field. When a person walks across a floor, a charge (static electricity) builds up in his/her body due to the friction between his/her shoe material and the flooring material. If he/she approaches or touches an object with a lower electrostatic potential, then the static electricity discharges from his/her body into the object. Static electricity can damage or degrade electronic components, therefore integrated circuits have to resist electrostatic stress in harsh industrial environments or on human hand contact. One discharge in the wrong place can destroy expensive circuits and cause errors, "down time" and production delays.

Figure 22:
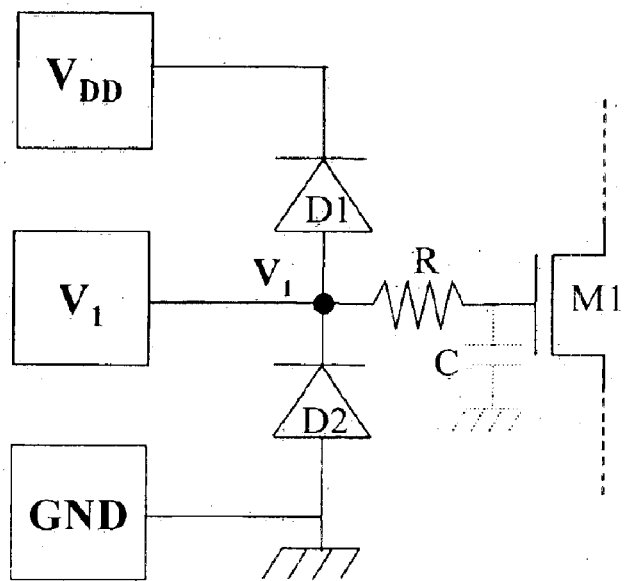
FIG. 22 is a representation of a conventional ESD protection circuit.

Most manufacturers develop their own architectures that best fit to their technology. However, the basic protection principles are always similar. They are based on reverse biased diodes connected between the node to be protected and both power supplies or power supply and ground. The principle is always the same, i.e. evacuate as fast as possible all excess charges inducing voltages out of the admissible power supply voltage range. This is represented on FIG. 22. If node $V_1$ exceeds $V_{DD}$ or drops under the ground level by a diode drop, diode $D_1$ or $D_2$ has to discharge node $V_1$ as fast as possible in order to protect the thin gate oxide of transistor $M_1$. Some RC delays are usually introduced in order to give more time to diodes to evacuate the excess charge applied on pin $V_1$. Diodes $D_1$ and $D_2$ can drive high currents if their saturation current is high. However, a high saturation current means more leakage current. This can beta problem for ultra low power application, for analog circuits or for high temperature applications.

The proposed ULP ESD solution of the present invention is to use the ULP diode of the present invention with a high saturation current in order to implement diodes $D_1$ and $D_2$. This allows a large forward current while keeping a low leakage current in normal regime.

It is to be noted that this architecture with ULP diodes is exactly the same as the ULP memory cell according to previous embodiment of the present invention presented previously in FIG. 20 (but with different sizes). This means that such ESD protection can also regenerate digital levels.

Operational Transconductance Amplifier

Figure 23:
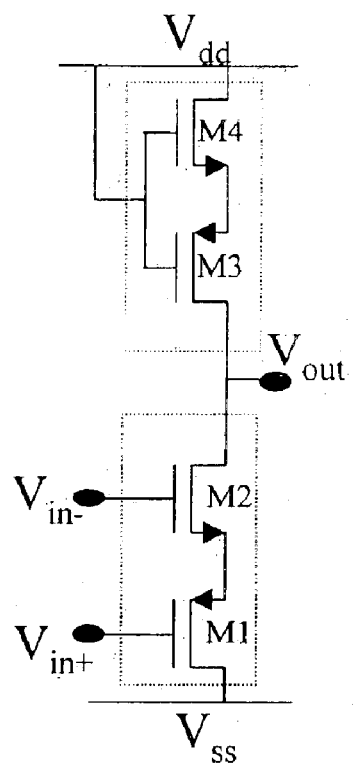
FIG. 23 is a representation of a basic ultra-low power operational transconductance amplifier according to the present invention.

According to an embodiment of the present invention, a ULP operational transconductance amplifier (OTA) is implemented, the basic architecture of which is depicted in FIG. 23. It comprises 4 transistors M1, M2, M3, M4. Transistors M1 and M2 act like an ULP differential transconductance while MOSFETs M3 and M4 are used as a ULP current source.

The theoretical DC gain of this amplifier is given by the relation $$A_{V_0} = \frac{gm_{diff}}{I} \cdot V_{EA_{equ}}$$

Where $gm_{diff}$ is the differential transconductance, i.e. about half the transconductance of M1 or M2 of FIG. 23. $V_{EA_{equ}}$ is the equivalent output Early voltage, i.e. about half the Early voltage of M2 if all transistors of FIG. 23 have the same length. If all MOSFETs are in weak inversion, then $$A_{V_0} \approx \frac{1}{2} \cdot \left(\frac{1}{n \cdot U_T}\right) \cdot \frac{1}{2}(V_{EA_{M2}})$$

For the FD-SOI process already mentioned above, considering device lengths of 2 μm (which corresponds to $V_{EA}$=14 V) and with a substrate effect n=1.08, a theoretical gain of 125 (42 dB) at room temperature is obtained.

The ULP OTA offset is the input differential voltage that should be applied in order to equalize the current of the upper current source with the current of the differential pair. With the FD-SOI process mentioned for example, using same sizes and only P2 channel doping for transistors M1 to M4, the offset would be zero if substrate effects and matching were neglected. If all devices work in weak inversion (which is the case in the example given), a current difference between the upper and the lower part of FIG. 23 can be easily compensated by a small differential input voltage, thanks to the current exponential dependence on the differential voltage (a current error of 10% would correspond to an offset of 5.8 mV at room temperature), whereas a current ratio of 10 between the upper and the lower part (supposing no differential voltage) corresponds to an offset of about 2×70=140 mV.

If the doping type or the size of the upper current source differs from the doping type or size of the lower differential transconductance, this creates some offset. Indeed, FIG. 4 shows that the intersection of n- and p-MOSFETs IdVg curves for the same channel doping does not occur exactly at a same current level for each doping dose. For a well characterised process, it is possible to compensate this current difference by an adequate sizing of each of the devices in order to reduce the OTA systematic offset.

The input common mode range of the OTA according to the present invention depends on the used channel doping level. Still considering for example that all devices of FIG. 23 have same size an same doping type (e.g. P2), then minimum input common mode level must ensure that the source node between transistors M1 and M2 is at a voltage higher than $3.U_T$ versus $V_{SS}$ ($U_T$ is the thermal voltage) in order to keep transistor M1 saturated. Using eq.2 and values previously obtained for P2 doping type, it is found that the minimum input common mode voltage is (for $V_{back}$=0V):

$$V_{CM_{in\ min}} = V_{SS} + \lambda(3.U_T + 0.21)$$

If $V_{SS}$=0V, a minimum input common mode value of 0.31V at room temperature is found.

On the other hand, the input common mode upper limit also depends on the upper current source of FIG. 23. With the implementation of the current source in FIG. 23, only P2 and P12 channel doping can be used in order to ensure saturation of transistor M4. In order to keep all devices saturated, the maximum input common mode voltage is given by:

$$V_{CM_{in\ max}} = V_{DD} - \lambda(6.U_T)$$

If transistors M1 and M2 channels were doped at a level P12 of P2 and if transistor M3 and M4 are still P2 doped, then the minimum and the maximum common mode voltage would be both about 200 mV higher (based on the values previously calculated). With this other doping configuration (i.e. P12 type doping for the lower differential transconductance, and P2 doping for the upper current source), the input common mode can reach $V_{DD}$. The table hereinafter summarises the common mode range of the OTA of FIG. 23 as a function of the differential transconductance doping level (I, P1, P2 or P12) with an upper current source doped at a P2 level.

| Doping level\ input CM | min | max |
| --- | --- | --- |
| I | $\lambda(3.U_T - 0.49)$ | $V_{DD}-\lambda (6.U_T + 0.70)$ |
| P1 | $\lambda(3.U_T - 0.30)$ | $V_{DD}-\lambda (6.U_T + 0.51)$ |
| P2 | $\lambda(3.U_T + 0.21)$ | $V_{DD}-\lambda (6.U_T)$ |
| P12 | $\lambda(3.U_T + 0.41)$ | $V_{DD}-\lambda (6.U_T - 0.2)$ |

Figure 24:
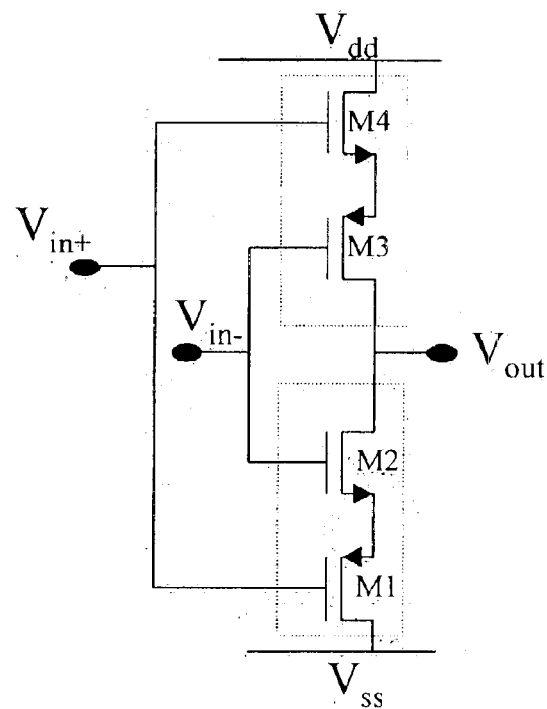
FIG. 24 is a representation of a ULP OTA architecture based on two differential transconductances according to the present invention.

It is also possible to implement a ULP OTA using two different transconductances instead of one associated with a current source, as shown in FIG. 24. This allows to approximately double the amplifier transconductance (or gain). On the other hand, the output voltage dynamic range is limited to some hundreds of milli-volts (depending on the channel doping level) around the input common mode value.

Figure 25:
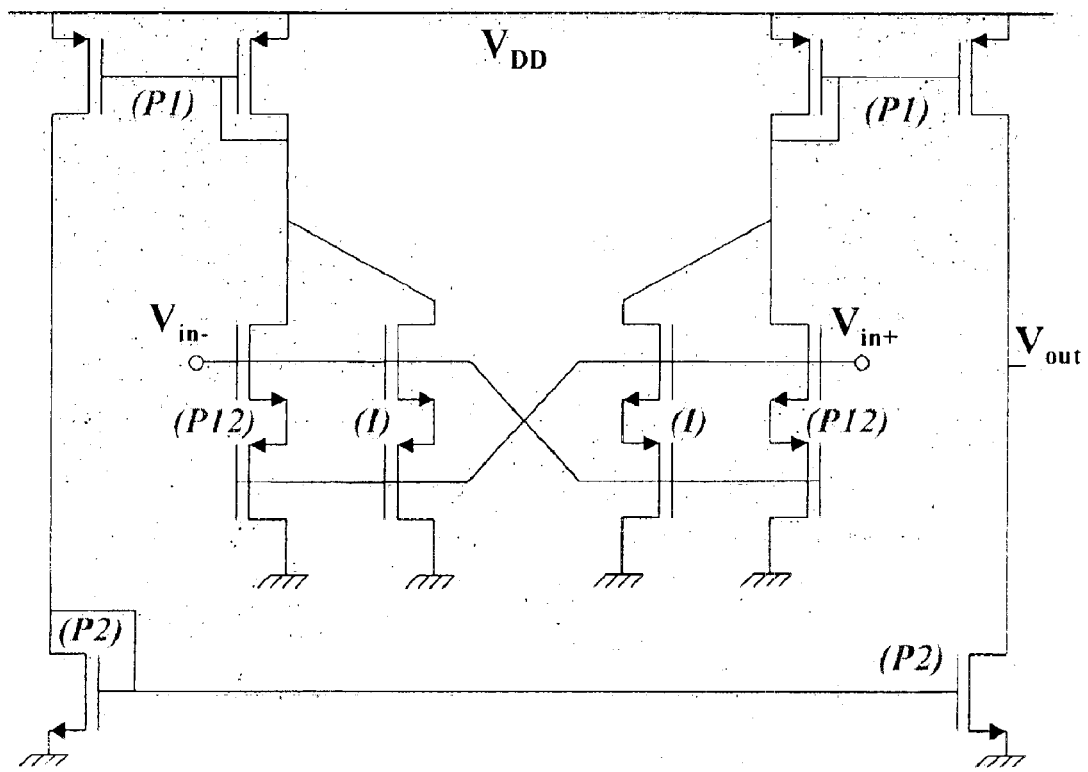
FIG. 25 is a representation of a rail to rail (input and output) ULP OTA architecture according to the present invention.

FIG. 25 represents a rail to rail (input and output) ULP OTA architecture. The input rail to rail is achieved thanks to two differently doped differential transconductances in parallel (P12 and I type in the example given). For an input common mode voltage range far from $V_{DD}$ and $V_{SS}$, both input transconductances work in parallel. For an input common mode voltage close to $V_{SS}$, only the weakly P type doped transconductance will be active (I doping level in the example given), the other being strongly desaturated. In the other case of high input common mode voltage, only the strongly P type doped transconductance will be active (P12 doping level in the example given).

In this case, the gain is only weakly dependent on the input common mode value. For a zero differential input voltage, the overall amplifier current consumption at room temperature is about 5 pA. In practice, the leakage current level has to be much lower than the amplifier current consumption. This will be the case if the n- and p-MOSFET intersection (for the same channel doping) of FIG. 4 happens at a sufficiently higher current level than the devices leakage current level.

The common mode rejection ratio (CMRR) of this rail to rail amplifier depends on the difference of the substrate effect value for n- and p-MOSFETs. Indeed, when the ULP differential transconductance input common mode changes, the common n- and p-MOSFET source follows this change (as shown in FIG. 8). Therefore, the back gate to source voltage is always identical for n- and p-MOSFETs. This means that if they have a same substrate effect, their relative IdVg curves are shifted by a same amount, but they will always cross at a same current level (but different voltage level).

Compared to a standard OTA architecture, the ULP architecture does not limit the output current versus the differential input voltage (this is based on FIG. 11(a)—current dependent on voltage).

DTMOS Transistor with Input Current Limitation

A dynamic threshold MOS (DTMOS) transistor according to the prior art comprises a MOS transistor of which the substrate is connected to the gate of the transistor. Given the fact that the threshold voltage of a MOS transistor decreases more as the substrate is positively polarised, the DTMOS transistor has a threshold voltage which decreases by increasing the gate to source voltage of the transistor. This results in a quicker transition from the non-conducting to the conducting mode of the transistor. A disadvantage of this type of transistors is that as from a gate to source tension in the order of 0.5–0.6 V, the substrate current is not negligible anymore, as the diode formed between substrate and source becomes current conducting. This current strongly deteriorates the input impedance of the transistor.

Figure 26:
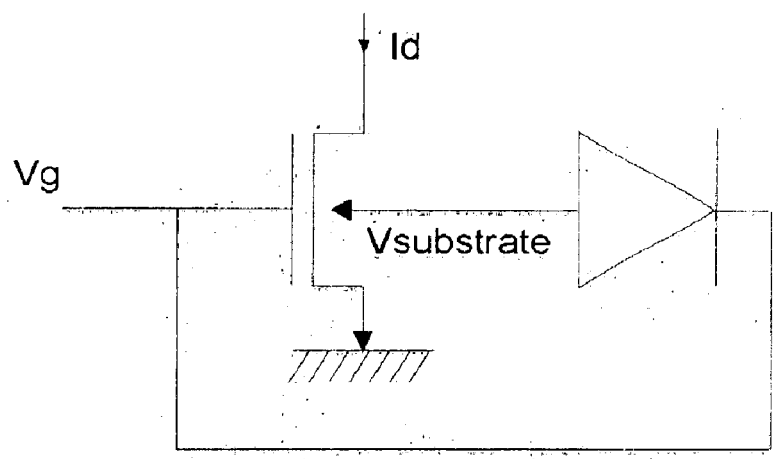
FIG. 26 is a representation of at DTMOS transistor with a ULP diode between the gate and the bulk contact.

In order to overcome this problem, according to the present invention, a diode according to the present invention is introduced between the gate and the substrate contact, as shown in FIG. 26. The current characteristic in function of the voltage over the diode, as shown in FIG. 16b shows that, with relation to the new DTMOS device with ULP diode, the input current will be limited as from a certain input voltage. Indeed, if at first $V_{GS}$ is zero and is augmented, the substrate will first be current conducting (which current is negligible—in the order of $\mu A$) which allows a good polarisation of the substrate (diode slightly reversed biased). Thereafter, as the gate to source voltage $V_{GS}$ increases, less and less current will pass through the diode, and will quickly limit the substrate current. An optimisation of the doping levels used in the diode allows the regulation of the maximum bulk current of the transistor.

While the invention has been shown and described with reference to preferred embodiments, it will be understood by those skilled in the art that various changes or modifications in form and detail may be made without departing from the scope and spirit of this invention.

For example, while the threshold voltage of the MOSFETs has been changed by varying the channel doping, other techniques may be used. Where intrinsic n- and p-MOS transistors are used, also n- and p-MOS transistors with other channel doping levels may be used. In the description an SOI MOS process is used for obtaining specific transistors; if other processes are used, other values may be found for each of the variables calculated hereinabove.

What is claimed is:

1. A diode having a first and a second terminal, the diode comprising an n-MOS transistor having a channel, a first N+ doped diffusion region at one extremity of the channel and a second N+ diffusion region at the other extremity of the channel, and a p-MOS transistor having a channel and a first P+ doped diffusion region at one extremity of the channel and a second P+ diffusion region at the other extremity of the channel, the first N+ diffusion region of the n-MOS transistor being coupled t the first P+ diffusion region of the p-MOS transistor, the gate of the n-MOS transistor being coupled to the second P+ diffusion region of the p-MOS transistor, and the gate of the p-MOS transistor being coupled to the second N+ diffusion region of the n-MOS transistor, and the second P+ diffusion region of the p-MOS transistor being coupled to the first terminal of the diode and the second N+ diffusion region of the n-MOS transistor being coupled to the second terminal of the diode, a current versus voltage characteristic of the diode being such that it has a negative slope in a reverse biased state of the diode.

2. A diode according to claim 1, whereby the current versus voltage characteristic of the diode substantially passes through the origin of the current voltage characteristic.

3. Voltage doubler comprising two diodes coupled in series between a supply voltage node and an output node, the anode of the first diode being coupled to the supply voltage node, and the cathode of the second diode being coupled to the output node, a clock signal switching between a first and a second voltage level being applied to the node between the cathode of the first diode and the anode of the second diode, and a load capacitance being connected to the output node, whereby the two diodes are diodes according to any of claim 1 or 2.

4. Memory cell comprising two ultra-low power diodes according to claim 1 coupled in series reversely biased between a first low voltage level and a second high voltage level, the voltage level of the memory cell being present at the node between the two ultra-low power diodes.

5. Use of the memory cell of claim 4 as a level holder in domino logic.

6. Use of the memory cell of claim 4 as a level restoring device in pass gate logic.

7. Use of the memory cell of claim 4 as a data storing device in a D latch.

8. Use of the memory cell of claim 4 to maintain information on high impedance floating nodes in digital circuits.

9. Use of the memory cell of claim 4 as a level keeper device in MTCMOS circuits.

10. Electrostatic discharge protection circuit comprising a first reverse biased diode between a node to be protected and a first power supply and a second reverse biased diode between the node to be protected and a second power supply, whereby the diodes are diodes according to claim 1.

* * * * *